(12) United States Patent
Zhan

(10) Patent No.: US 9,831,327 B2
(45) Date of Patent: Nov. 28, 2017

(54) ELECTROSTATIC DISCHARGE PROTECTION DEVICES AND METHODS OF FORMING THE SAME

(71) Applicant: Freescale Semiconductor, Inc., Austin, TX (US)

(72) Inventor: Rouying Zhan, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/858,985

(22) Filed: Sep. 18, 2015

(65) Prior Publication Data
US 2017/0084599 A1    Mar. 23, 2017

(51) Int. Cl.
*H01L 29/73* (2006.01)
*H01L 27/02* (2006.01)

(52) U.S. Cl.
CPC .......... H01L 29/73 (2013.01); H01L 27/0259 (2013.01)

(58) Field of Classification Search
CPC ............. H01L 29/0821; H01L 27/0259; H01L 29/0804; H01L 29/1004; H01L 21/8222
See application file for complete search history.

(56) References Cited

U.S. PATENT DOCUMENTS

| | | | |
|---|---|---|---|
| 7,061,051 B2 | 6/2006 | Yu | |
| 2008/0237656 A1* | 10/2008 | Williams | .............. H01L 21/761 257/262 |
| 2013/0279051 A1* | 10/2013 | Gill | ........................ H02H 9/041 361/56 |
| 2014/0347771 A1 | 11/2014 | Zhan et al. | |
| 2015/0060941 A1 | 3/2015 | Hwang | |
| 2015/0102384 A1 | 4/2015 | Zhan et al. | |
| 2016/0204598 A1* | 7/2016 | Wang | ....................... H02H 9/04 361/56 |

OTHER PUBLICATIONS

U.S. Appl. No. 14/327,191, filed Jul. 9, 2014, Zhan et al.

* cited by examiner

*Primary Examiner* — Allen Parker
*Assistant Examiner* — Ismail Muse

(57) ABSTRACT

Electrostatic discharge (ESD) protection devices and methods. The ESD protection devices include a semiconductor substrate, a buried semiconducting layer, and an overlying semiconducting layer. The ESD protection devices also include a first bipolar device that includes a first bipolar device region, a first device base region, and a first device emitter region. The ESD protection devices also include a second bipolar device that includes a second bipolar device region, a second device well, a second device base region, and a second device emitter region. The ESD protection devices further include a sinker well that electrically separates the first bipolar device from the second bipolar device. The ESD protection devices are configured to transition from an off state to an on state responsive to receipt of greater than a threshold ESD voltage by the first device base region. The methods include methods of forming the ESD protection device.

17 Claims, 11 Drawing Sheets

ELECTROSTATIC DISCHARGE PROTECTION DEVICES AND METHODS OF FORMING THE SAME

FIELD

This disclosure relates generally to electronic devices and, more specifically, to electrostatic discharge protection devices and methods.

BACKGROUND

Modern electronic devices, and particularly integrated circuits, are at risk of damage due to electrostatic discharge (ESD) events. During an ESD event, a voltage (or current) can be provided to one or more terminals of the electronic device that causes the voltage between those terminals to exceed the maximum designed voltage of the electronic device. Such an event can impair subsequent operation of the electronic device. For example, a voltage at a terminal of the electronic device during an ESD event can exceed a breakdown voltage of one or more components of the electronic device, and thereby potentially damage those components. Accordingly, electronic devices often include an ESD protection device that provides protection from excessive voltages during ESD events.

To avoid interfering with normal operation of the electronic device being protected, the ESD protection device typically is designed to turn on and to conduct current when an applied voltage exceeds an operating voltage of the electronic device but before the applied voltage exceeds the breakdown voltage of the electronic device. In practice, there often is a difference between a transient triggering voltage and a steady state (or direct current) voltage that can be maintained by the ESD protection device. This voltage difference can make it difficult for the ESD protection device to fit within the design window defined by the respective operating and breakdown voltages of the electronic device to be protected (or alternatively, constrains the circuit designer to operating and breakdown voltages that accommodate the difference in the triggering voltage and the steady state voltage of the ESD protection device). In addition, ESD protection devices often exhibit a significant voltage overshoot during rapid voltage transients. This voltage overshoot can cause the voltage experienced by the electronic device being protected to exceed the breakdown voltage thereof. Furthermore, when multiple ESD protection devices are used to provide higher levels of ESD voltage protection, the voltage overshoot is multiplied, which further constrains circuit designers or increases a potential for damage to the electronic device being protected.

BRIEF DESCRIPTION OF THE DRAWINGS

The present invention is illustrated by way of example and is not limited by the accompanying Figures, in which like references indicate similar elements. Elements in the Figures are illustrated for simplicity and clarity and have not necessarily been drawn to scale.

DETAILED DESCRIPTION

The electrostatic discharge (ESD) protection devices disclosed herein exhibit significantly lower voltage overshoot when compared to traditional ESD protection devices. In one example, the voltage overshoot was decreased by 8-13%. This decrease in voltage overshoot is accomplished by coupling an NPN bipolar transistor in series with a PNP bipolar transistor to form the disclosed ESD protection devices. This configuration decreases the length of current flow in the disclosed ESD protection devices when compared to the traditional ESD protection devices. In the above example, the length of current flow was reduced by approximately 16%. As an additional benefit, the disclosed ESD protection devices also exhibit a smaller footprint than traditional ESD protection devices. In the above example, an area occupied by the disclosed ESD protection devices is approximately 12% less than an area occupied by the traditional ESD protection devices.

Figure 1:
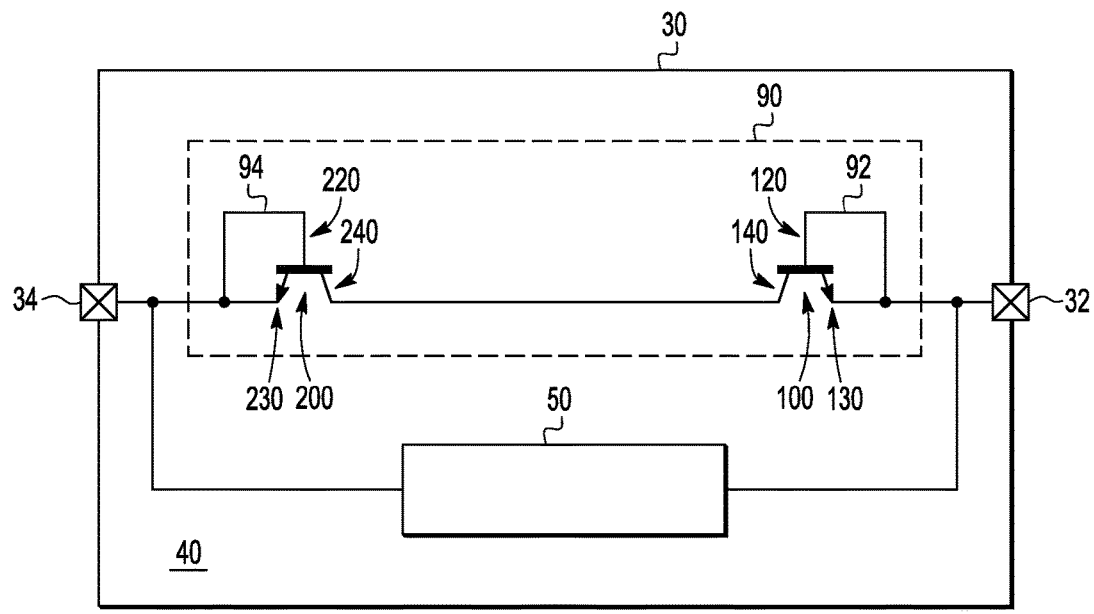
FIG. 1 is a schematic diagram of an electronic device package that includes an ESD protection device.

FIG. 1 is a schematic diagram of an electronic device package 30, which also can be referred to herein as an electronic device 30, that can include or utilize ESD protection devices 90 disclosed herein. Electronic device package 30 includes one or more package interfaces 32, 34, functional circuitry 50 coupled to the package interfaces 32, 34, and an ESD protection device 90 coupled to the interfaces 32 and 34. Functional circuitry 50 also can be referred to herein as an electronic device being protected 50.

Functional circuitry 50 and ESD protection device 90 can be formed, fabricated, mounted, or otherwise provided on a substrate 40 and encapsulated in a common device package to form electronic device 30. As an example, substrate 40 can be a semiconductor substrate having both functional circuitry 50 and ESD protection device 90 fabricated thereon. Additionally or alternatively, substrate 40 can be a package substrate (e.g., a lead frame, circuit board, or the like) to which functional circuitry 50 and ESD protection device 90 can be soldered, affixed, or otherwise mounted. It should be understood that FIG. 1 is a simplified representation of electronic device 30 for purposes of explanation and ease of description, and FIG. 1 is not intended to limit the application or scope of the subject matter in any way. Thus, although FIG. 1 schematically depicts direct electrical connections between components, included embodiments can employ intervening circuit elements or components while still functioning in a substantially similar manner.

Package interfaces 32 and 34 can represent the physical input/output interfaces to/from functional circuitry 50 contained within electronic device 30. Depending on the embodiment, each package interface 32 and 34 can be realized as an individual pin, pad, lead, terminal, solder ball, or another suitable physical interface to electronic device 30. In accordance with one or more embodiments, a design (or intended) voltage for first package interface 32 can be greater than a design voltage for second package interface 34. For example, first package interface 32 can be realized as a positive reference (or supply) voltage input to electronic device 30, and second package interface 34 can be realized as a negative reference (or ground) voltage input to the electronic device 30. Accordingly, for purposes of explanation, but without limitation, first package interface 32 alternatively can be referred to herein as a higher voltage terminal 32, a positive reference voltage terminal 32, a supply voltage terminal 32, a device terminal 32, or the like, while second package interface 34 alternatively can be referred to herein as a lower voltage terminal 34, a negative reference voltage terminal 34, a ground voltage terminal 34, a device terminal 34, or the like.

Functional circuitry 50 generally represents components of electronic device 30 configured to provide a desired functionality for electronic device 30. In this regard, depending on the embodiment, functional circuitry 50 can be realized as any suitable combination of processing circuitry (e.g., one or more processing cores, processors, controllers, microcontrollers, microprocessors, or the like), logic circuitry, memories or other data storage elements, discrete components, analog or digital components, or other hardware components or circuitry configured to provide the desired functionality for electronic device 30. Functional circuitry 50 can be coupled to package interfaces 32 and 34 to receive a supply voltage, design voltage, or another operating voltage that facilitates the desired operation of functional circuitry 50.

Still referring to FIG. 1, ESD protection device 90 is electrically connected between higher voltage terminal 32 and lower voltage terminal 34 and is electrically in parallel with functional circuitry 50 to protect functional circuitry 50 from a transient voltage difference between device terminals 32 and 34 that exceeds a breakdown voltage ($V_B$) of functional circuitry 50. In the example of FIG. 1, ESD protection device 90 functions as an ESD voltage clamp that begins conducting current when the transient voltage difference between device terminals 32 and 34 exceeds a transient triggering voltage ($V_{T1}$) of ESD protection device 90. In this regard, both a steady state (or DC) breakdown voltage ($V_{TDC}$) and transient triggering voltage ($V_{T1}$) of ESD protection device 90 are chosen to be greater than a supply (or operating) voltage ($V_O$) of functional circuitry 50 but less than the breakdown voltage ($V_B$) of functional circuitry 50. In this manner, ESD protection device 90 conducts current when a voltage difference between terminals 32 and 34 exceeds an ESD triggering voltage (i.e., the DC breakdown voltage ($V_{TDC}$) or the transient triggering voltage ($V_{T1}$)) and thereby clamps the voltage difference to which the functional circuitry 50 is exposed. Thus, the likelihood of functional circuitry 50 being exposed to a voltage difference that exceeds the breakdown voltage ($V_B$) of functional circuitry 50 during an ESD event is reduced. Voltages $V_O$, $V_{T1}$, and $V_B$ are illustrated in FIG. 2 and discussed in more detail herein.

As illustrated in FIG. 1, ESD protection device 90 includes a pair of bipolar junction transistor (BJT) elements 100 and 200 configured to provide the ESD voltage clamp. BJT element 100 also can be referred to herein as a first bipolar device 100, and BJT element 200 also can be referred to herein as a second bipolar device 200.

First bipolar device 100 has a first emitter electrode 130 that is coupled to higher voltage terminal 32, a first base electrode 120 electrically connected directly to the first emitter electrode (e.g., short-circuited or via a negligible series impedance, such as via an anode electrical connection 92) and thus also coupled to higher voltage terminal 32, and a first collector electrode 140 coupled to a second collector electrode 240 of second bipolar device 200. First emitter electrode 130 also can be referred to herein as a first device emitter region 130, and first base electrode 120 also can be referred to herein as a first device base region 120. Collector electrodes 140 and 240 of bipolar devices 100 and 200 are realized using a common doped region. That is, the bipolar devices share a common collector electrode region formed in semiconductor substrate 40. A second emitter electrode 230 of second bipolar device 200 is coupled to lower voltage terminal 34, and a second base electrode 220 of second bipolar device 200 is electrically connected (or short-circuited, such as via a cathode electrical connection 94) to second emitter electrode 230 and coupled to lower voltage terminal 34. Second emitter electrode 230 also can be referred to herein as a second device emitter region 230, and second base electrode 220 also can be referred to herein as a second device base region 220.

Figure 2:
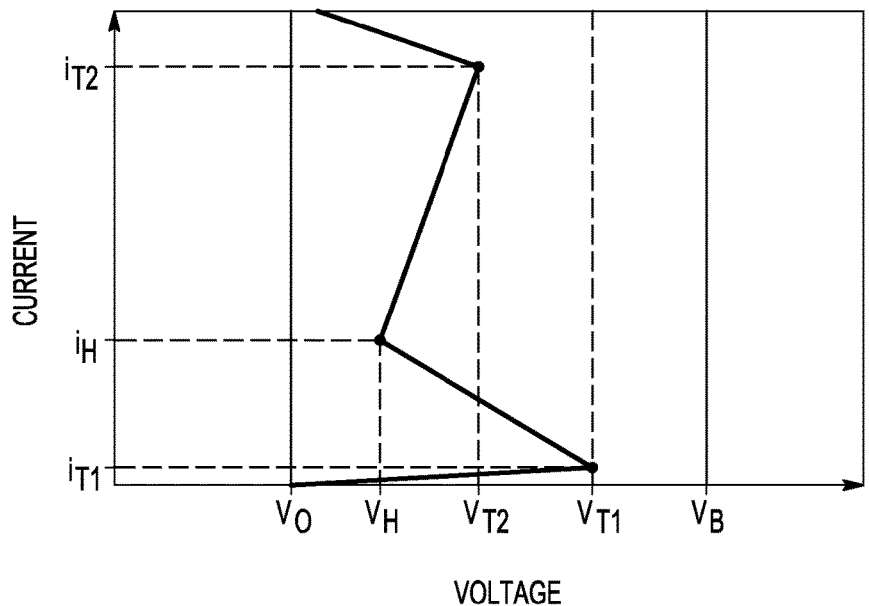
FIG. 2 is a graph depicting current flow through an ESD protection device as a function of voltage applied to the ESD protection device during an ESD event.

FIG. 2 is a graph depicting current flow through an ESD protection device as a function of voltage applied to the ESD protection device during an ESD event. Referring to FIGS. 1-2, as voltage applied to device terminals 32 and 34 is increased, very little current flows through ESD protection device 90 until the transient triggering voltage ($V_{T1}$) of ESD protection device 90 is reached. When $V_{T1}$ of ESD protection device 90 is reached, avalanche breakdown in second bipolar device 200 occurs, and ESD protection device 90 begins conducting an ESD discharge current. The current through the ESD protection device 90 increases from a triggering current ($i_{T1}$) at the transient triggering point to a holding current ($i_H$) at a holding (or snapback) voltage ($V_H$). If the applied ESD voltage (or current) increases, the discharge current through ESD protection device 90 increases until a thermal breakdown current ($i_{T2}$) is reached at voltage ($V_{T2}$), at which point functionality of the ESD protection device 90 can be irreversibly impaired. This current ($i_{T2}$) alternatively can be referred to as the damage onset threshold current. The DC breakdown voltage ($V_{TDC}$) of the ESD protection device 90 typically is less than the transient triggering voltage ($V_{T1}$).

As the applied voltage decreases below the holding voltage, ESD protection device 90 stops conducting current. In this regard, when the difference between the triggering voltage and the holding voltage (e.g., $V_{T1}-V_H$) is relatively small, ESD protection device 90 is effectively a non-snapback ESD clamp or otherwise exhibits non-snapback behavior, because the ESD clamp effectively stops conducting current when the applied voltage falls below the triggering voltage. For example, when the holding voltage ($V_H$) is greater than the design voltage for the functional circuitry 50, ESD protection device 90 stops conducting current once the applied voltage returns to the design voltage without any power cycling.

Figure 3:
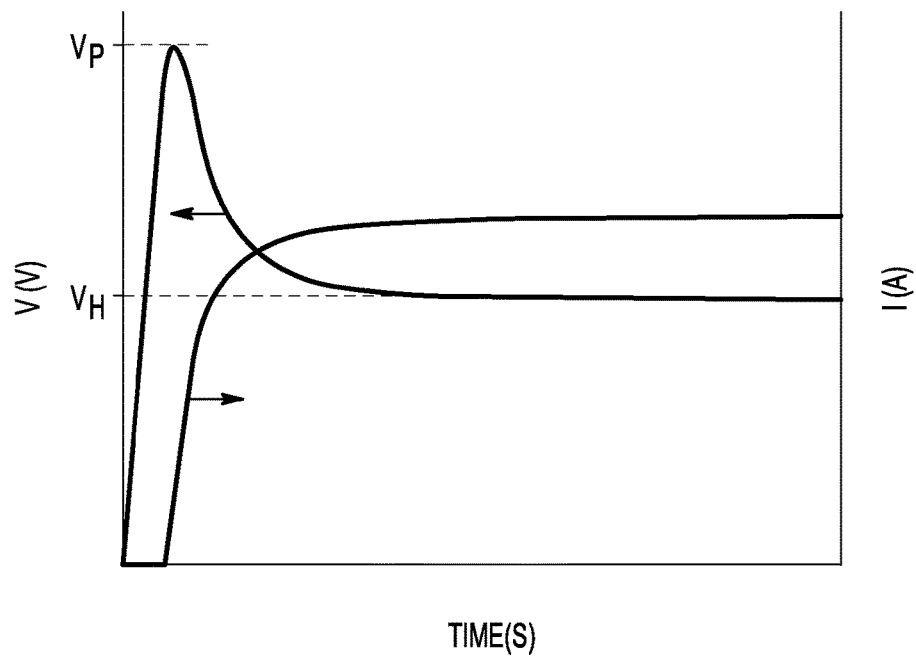
FIG. 3 is a plot of voltage across an ESD protection device and current through the ESD protection device as a function of time during a rapid voltage transient across the ESD protection device.

FIG. 3 is a plot of voltage across an ESD protection device 90 and current through the ESD protection device as a function of time during a rapid voltage transient across the ESD protection device (e.g., across package interfaces 32 and 34 of FIG. 1). As illustrated in FIG. 3, the voltage across ESD protection device 90 often will overshoot to a peak voltage ($V_P$) before subsequently decreasing to the holding voltage ($V_H$) of the ESD protection device. The difference between the peak voltage ($V_P$) and the holding voltage ($V_H$) is referred to herein as the voltage overshoot of the ESD protection device. As discussed, ESD protection devices 90, which are disclosed herein, are configured to decrease a magnitude of the voltage overshoot when compared to traditional ESD protection devices. This decrease in the magnitude of the voltage overshoot can provide a circuit designer with additional flexibility in utilizing ESD protection devices 90 or can provide additional protection for functional circuity 50 that is protected by ESD protection devices 90.

Figure 4:
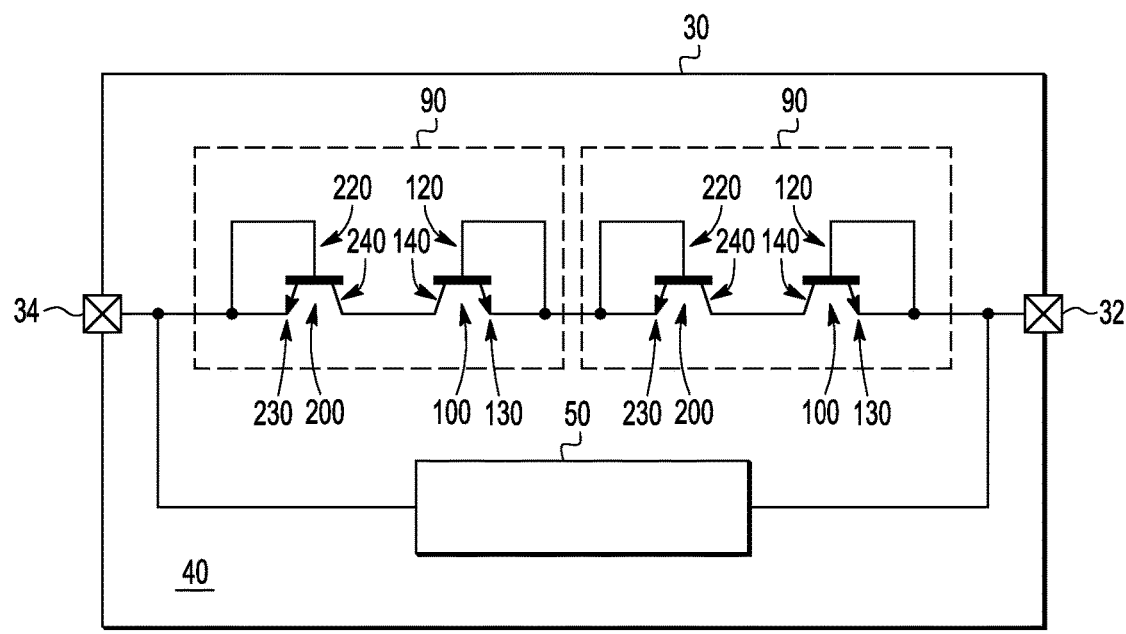
FIG. 4 is a schematic diagram illustrating a plurality of ESD protection devices cascaded in series.

As illustrated in FIG. 4, in some embodiments, multiple instances of ESD protection device 90 are stacked or cascaded electrically in series between device terminals 32, 34 to achieve greater triggering voltages. For example, electronic device package 30 depicted in FIG. 4 utilizes two instances of ESD protection device 90 that are configured electrically in series between the device terminals 32, 34 (e.g., by providing an electrical connection from a second emitter electrode 230 of one instance of ESD protection device 90 to a first emitter electrode 130 of another instance of ESD protection device 90) to achieve a triggering voltage that is greater than the triggering voltage achievable by a single ESD protection device 90.

Two or more ESD protection devices 90 can be cascaded electrically in series in any suitable manner. As an example, a substrate 40 of electronic device package 30 including cascaded ESD protection devices 90 can be realized as a silicon on insulator (SOI) substrate that provides vertical isolation, which, in turn, allows the cascaded instances of the ESD protection device 90 to be formed or otherwise provided on substrate 40 adjacent to or otherwise proximate one another, as illustrated in FIG. 4. In this regard, the vertical isolation provided by the SOI substrate combined with lateral isolation (e.g., deep trench isolation) between instances of the ESD protection device 90 prevents the substrate voltage underlying one instance of ESD protection device 90 from influencing the breakdown of an adjacent instance of ESD protection device 90. As another example, a plurality of ESD protection devices 90 can be stacked when fabricated on a bulk substrate by providing an appropriate doping profile that isolates the ESD protection devices 90 from a surrounding bulk substrate (e.g., by using N-type well regions and buried regions to provide isolation from a P-type bulk substrate).

Figure 5:
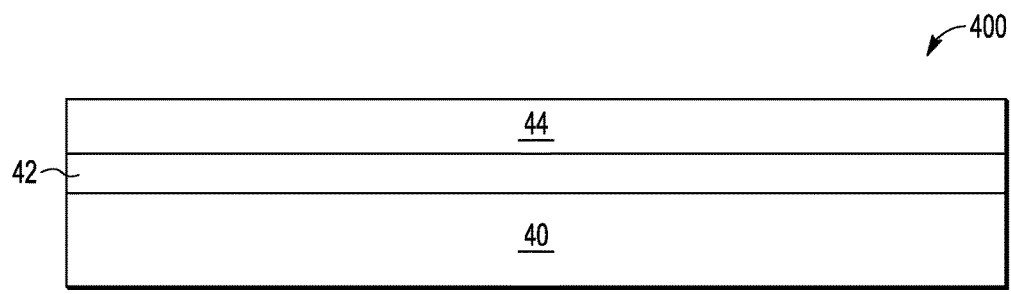
FIG. 5 is a schematic cross-sectional view of a step in a process flow for fabricating ESD protection devices.
Figure 20:
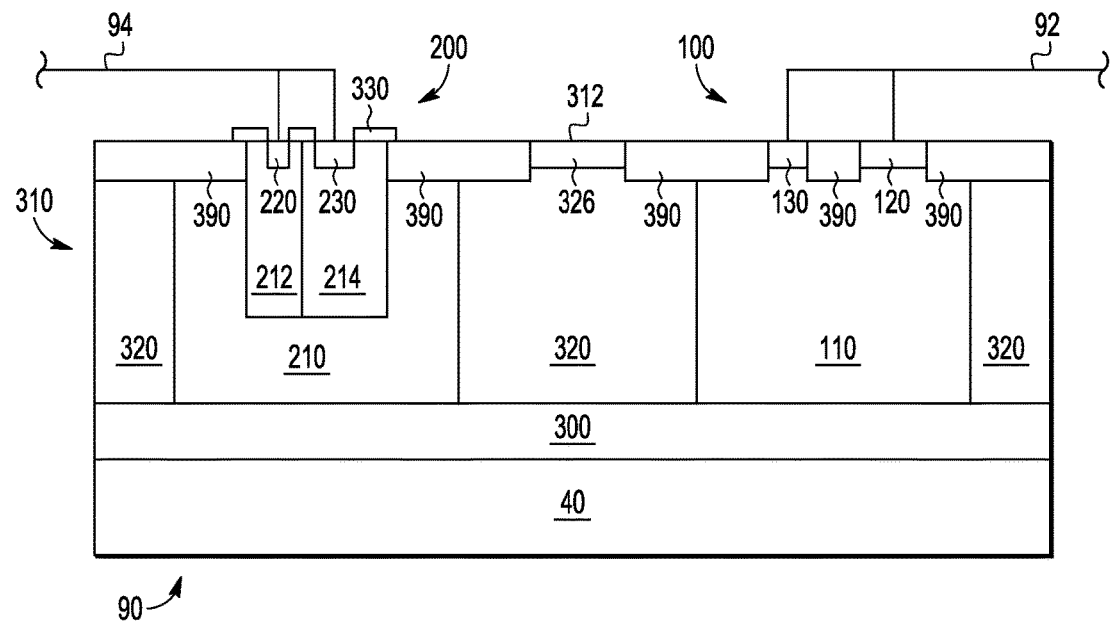
FIG. 20 is a schematic cross-sectional view of an ESD protection device.

FIGS. 5-17 are schematic cross-sectional views of steps in a process flow 400 for fabricating an ESD protection device 90. As illustrated in FIG. 5, process flow 400 can utilize a semiconductor substrate 40, which also can be referred to herein as a substrate 40, that includes, or has formed thereon, a buried oxide layer 42 and an epitaxial seed layer 44. Such a substrate can be referred to herein as a silicon on insulator, or SOI, substrate 40. The buried oxide layer extends between, or completely between, the substrate and the epitaxial seed layer. In addition, the buried oxide layer electrically insulates, or isolates, the substrate from the epitaxial seed layer. Both the buried oxide layer and the epitaxial seed layer are supported by the substrate. Buried oxide layer 42 is optional, and a substrate 40 that does not include the buried oxide layer also can be utilized. Examples of ESD protection devices 90 that do not include buried oxide layer 42 are illustrated in FIGS. 18 and 20 and discussed in more detail herein with reference thereto.

As used herein, the phrase "supported by," when referring to a relationship between semiconductor substrate 40 and one or more components of ESD protection device 90, is intended to indicate that the one or more components are "supported by" semiconductor substrate 40 in any suitable manner, including those that are conventional to semiconductor manufacturing technologies. As examples, the one or more components can be attached to the substrate, can be formed on the substrate, or can be formed in the substrate. As additional examples, the one or more components can be formed within the substrate, can be formed over the substrate, or can be formed above the substrate. As further examples, the one or more components can extend from the substrate, can extend within the substrate, or can extend above the substrate. As additional examples, the one or more components can extend over the substrate, can be formed within a layer that is supported by the substrate, or can extend within the layer that is supported by the substrate.

The substrate can have a first conductivity type or a second conductivity type that is different from the first conductivity type. Similarly, and since the buried oxide layer electrically isolates the epitaxial seed layer from the substrate, the epitaxial seed layer can have the first conductivity type or the second conductivity type. The first conductivity type can be N-type (i.e., can utilize electrons as the majority charge carrier) or P-type ((i.e., can utilize holes as the majority charge carrier). The second conductivity type is the opposite of the first conductivity type. Thus, when the first conductivity type is N-type, the second conductivity type is P-type. Conversely, when the first conductivity type is P-type, the second conductivity type is N-type.

In general, structures, materials, layers, or regions of an electronic device package 30 or of an ESD protection device 90 (as illustrated in FIGS. 1 and 4) that are indicated as having the first conductivity type or the second conductivity type are formed from a semiconducting material that has been doped to have the specified conductivity type. Examples of semiconducting materials include silicon, gallium arsenide, or Group III-V semiconducting materials. These semiconducting materials can be doped with an N-type dopant, thereby causing the semiconducting materials to be N-type, or with a P-type dopant, thereby causing the semiconducting materials to be P-type. Examples of N-type dopants include Group V elements, such as phosphorous, arsenic, and antimony. Examples of P-type dopants include Group III elements, such as boron, gallium, or indium.

Buried oxide layer 42 can include any suitable electrically insulating, or dielectric, layer that extends between the semiconductor substrate and the epitaxial seed layer. As an example, and when substrate 40 is silicon, buried oxide layer 42 can include, or be, a silicon oxide layer.

Epitaxial seed layer 44 can have a relatively low epitaxial layer peak doping concentration, such as epitaxial layer peak doping concentrations in the range of 1E15 cm$^{-3}$ to 8E15 cm$^{-3}$. Epitaxial seed layer 44 also can have a thickness that is relatively thin, such as in the range of 1 micrometer to 4 micrometers thick. However, these specific peak doping concentration and thickness ranges are not required.

Figure 6:
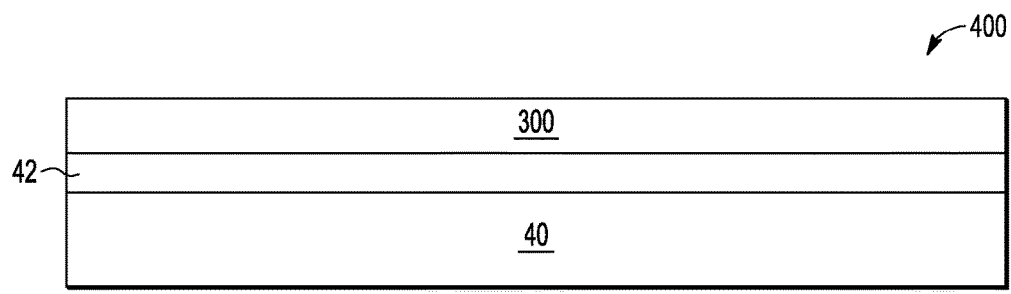
FIG. 6 is a schematic cross-sectional view of a step in a process flow for fabricating ESD protection devices.

As illustrated in FIG. 6, epitaxial seed layer 44 can be converted to a buried semiconducting layer 300 that is supported by substrate 40 or by buried oxide layer 42. Buried semiconducting layer 300 has the first conductivity type and can have a buried layer peak doping concentration in the range of 1E18 cm$^{-3}$ to 1E19 cm$^{-3}$, although this specific concentration range is not required. Additionally or alternatively, buried semiconducting layer 300 can have a buried layer peak doping concentration that is greater than a substrate peak doping concentration of substrate 40 or that is greater than the epitaxial layer peak doping concentration.

Epitaxial seed layer 44 can be converted to buried semiconducting layer 300 in any suitable manner. As examples, an implant process, a diffusion process, or an anneal process can be utilized to dope epitaxial seed layer 44 and to convert the epitaxial seed layer to the buried semiconducting layer. In one specific example, the buried semiconducting layer is N-type, and the epitaxial seed layer is doped with antimony or phosphorus to form the buried semiconducting layer. Generally, a thickness of the buried semiconducting layer corresponds to the thickness of the epitaxial seed layer and is in the range of 1 micrometer to 4 micrometers, although this specific thickness range is not required.

Figure 7:
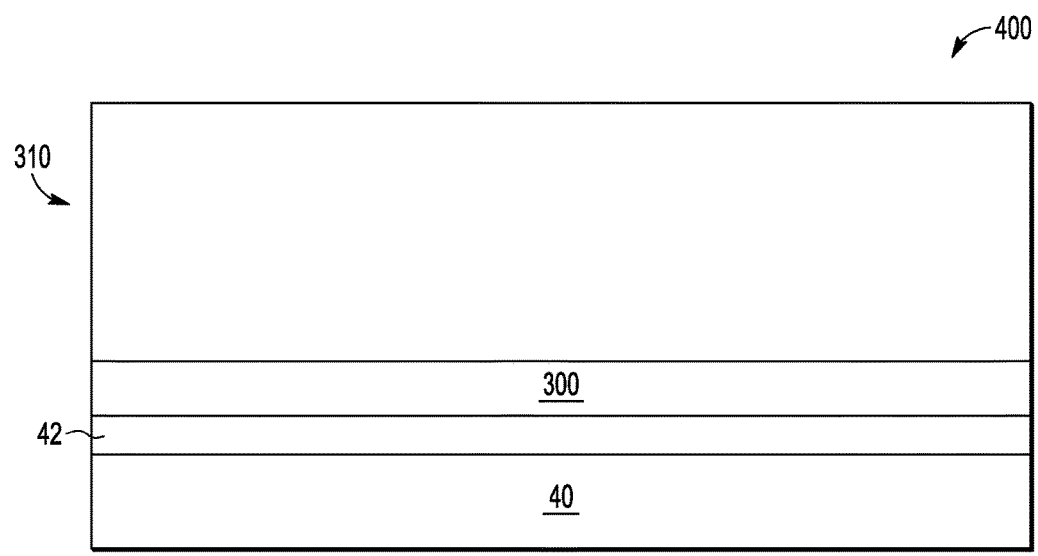
FIG. 7 is a schematic cross-sectional view of a step in a process flow for fabricating ESD protection devices.

As illustrated in FIG. 7, an overlying semiconducting layer 310 can be formed on substrate 40 such that the overlying semiconducting layer is supported by buried semiconducting layer 300. Overlying semiconducting layer 310 also can be referred to herein as an overlying layer 310. As illustrated, buried semiconducting layer 300 can extend between, at least partially between, or entirely between, substrate 40 and overlying semiconducting layer 310. The buried semiconducting layer also can electrically separate the overlying semiconducting layer from the substrate or can electrically separate at least a portion of the overlying semiconducting layer from the substrate. As illustrated in FIGS. 6-7, buried semiconducting layer 300 can be formed prior to overlying semiconducting layer 310.

Overlying semiconducting layer 310 has the second conductivity type and can be formed in any suitable manner or utilizing any suitable process, including those that are conventional to semiconductor manufacturing technologies. As examples, the overlying semiconducting layer can be formed utilizing a deposition process, an implant process, an anneal process, or an epitaxial growth process. Overlying semiconducting layer 310 generally will have a thickness in the range of 3 micrometers to 6 micrometers, although this specific thickness range is not required. Overlying semiconducting layer 310 generally will have a peak doping concentration in the range of 1E15 cm$^{-3}$ to 8E15 cm$^{-3}$; however, this specific concentration range is not required.

Figure 8:
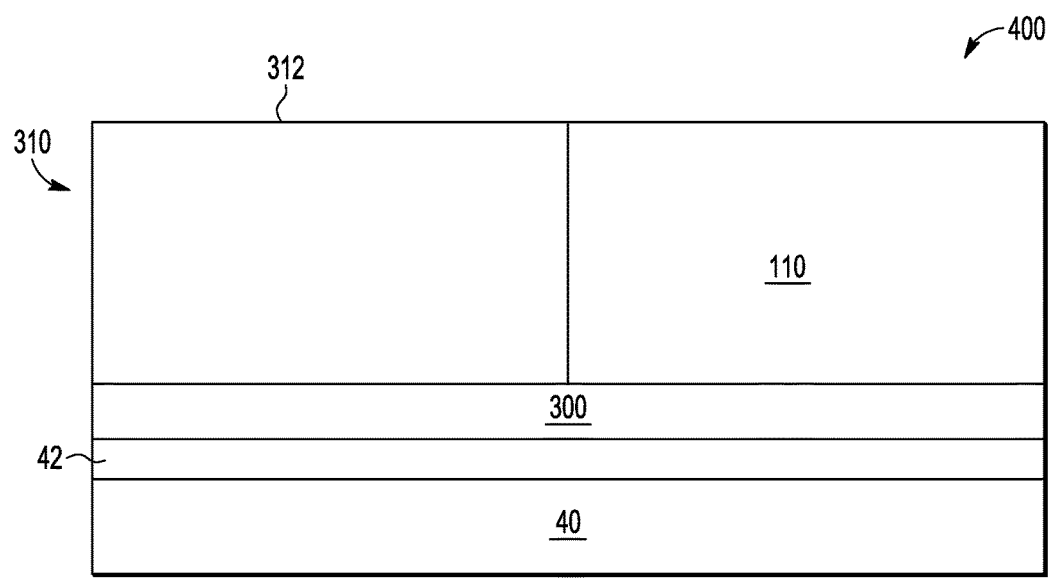
FIG. 8 is a schematic cross-sectional view of a step in a process flow for fabricating ESD protection devices.

As illustrated in FIG. 8, process flow 400 further can include forming a well 110, which has the first conductivity type, within overlying semiconducting layer 310. Well 110 can extend from an upper surface 312 of overlying semiconducting layer 310 to any suitable depth within overlying semiconducting layer 310. As examples, the depth of well 110 can be as little as 0.3 micrometers or as great as the thickness of the overlying semiconducting layer (i.e., well 110 can extend from upper surface 312 to buried semiconducting layer 300). Well 110, or at least a portion thereof, also can be referred to herein as a first bipolar device region 110 or as a first device region 110.

Well 110 can have a peak doping concentration, which also can be referred to herein as a first device region peak doping concentration, of 1E16 cm$^{-3}$ to 1E19 cm$^{-3}$, and in a particular embodiment, can have a peak doping concentration of 1E17 cm$^{-3}$ to 2E18 cm$^{-3}$; however, these specific concentration ranges are not required. In one specific example, well 110 is N-type and is formed utilizing phosphorous or arsenic as dopants.

Well 110 can be formed in any suitable manner, including those that are conventional to semiconductor manufacturing technologies. As examples, well 110 can be formed utilizing one or more of a lithography process, an implant process, a diffusion process, or an annealing process.

Figure 9:
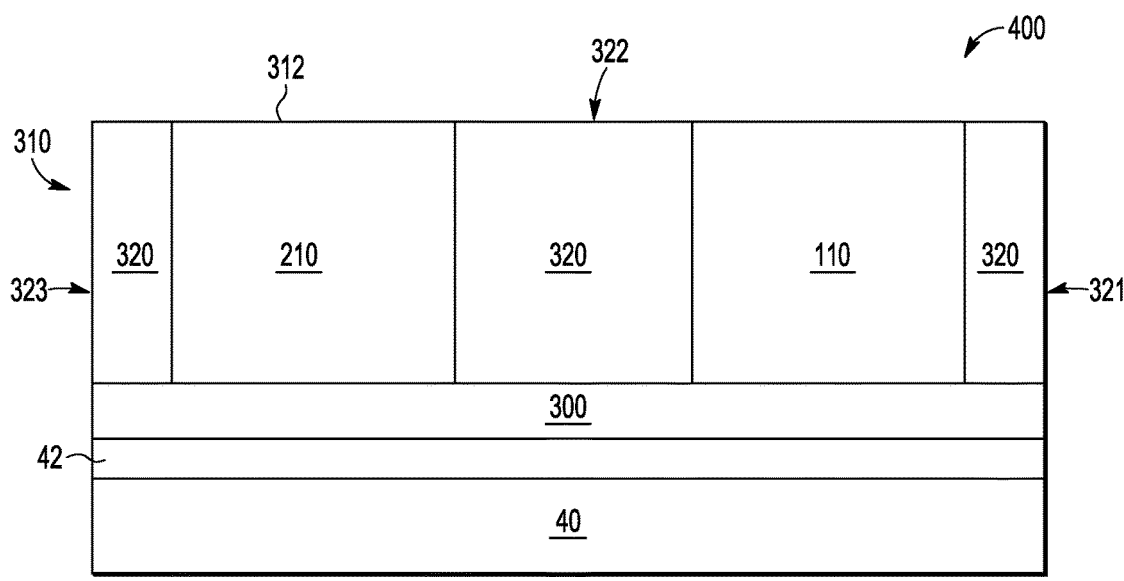
FIG. 9 is a schematic cross-sectional view of a step in a process flow for fabricating ESD protection devices.

As illustrated in FIG. 9, process flow 400 can include forming a sinker well 320 within overlying layer 310. Sinker well 320 can have the first conductivity type and can extend between first bipolar device region 110 and another portion 210 of overlying layer 310. The other portion of overlying layer 310 can be referred to herein as a second bipolar device region 210 or as a second device region 210. Additionally or alternatively, sinker well 320 also can electrically separate first bipolar device region 110 from second bipolar device region 210. Sinker well 320 generally will extend from upper surface 312 to, or into, buried semiconducting layer 300 such that the sinker well is electrically connected, or directly and electrically connected, to the buried semiconducting layer 300.

As illustrated in FIG. 9, sinker well 320 further can extend at least partially, or even completely, around first bipolar device region 110 and also can extend at least partially, or even completely, around second bipolar device region 210. Stated another way, first bipolar device region 110 can separate, or extend between, a first portion 321 of sinker well 320 and a second portion 322 of the sinker well. In addition, second bipolar device region 210 can separate, or extend between, second portion 322 of the sinker well and a third portion 323 of the sinker well.

Sinker well 320 can have a sinker well peak doping concentration that is greater than the first device region peak doping concentration. Examples of the sinker well peak doping concentration include concentrations of 1E16 cm$^{-3}$ to 1E19 cm$^{-3}$, and in a particular embodiment the sinker well can have a peak doping concentration in the range of 1E17 cm$^{-3}$ to 8E19 cm$^{-3}$; however, these specific concentration ranges are not required. In one specific example, sinker well 320 is N-type and is formed utilizing phosphorous or arsenic as dopants.

Sinker well 320 can be formed in any suitable manner, including those that are conventional to semiconductor manufacturing technologies. As examples, sinker well 320 can be formed utilizing one or more of a lithography process, an implant process, a diffusion process, or an annealing process.

Figure 10:
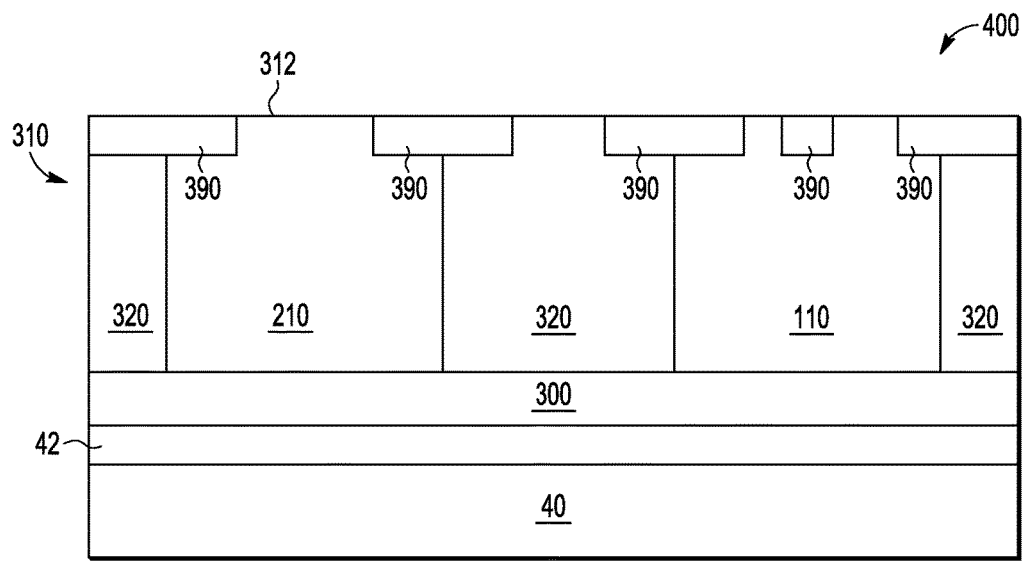
FIG. 10 is a schematic cross-sectional view of a step in a process flow for fabricating ESD protection devices.

As illustrated in FIG. 10, process flow 400 further can include forming a plurality of shallow trench isolation structures 390 within overlying layer 310. Shallow trench isolation structures 390 can extend from upper surface 312 of overlying layer 310 and into overlying layer 310 to a depth of 0.05 to 1.0 micrometer. In a particular embodiment, the depth of the shallow trench isolation structures can be 0.2 to 0.5 micrometers; however, these specific depth ranges are not required. Shallow trench isolation structures 390 can be formed by forming a shallow trench within overlying layer 310 and subsequently filling the shallow trench with a dielectric material, such as an oxide or a silicon oxide.

Shallow trench isolation structures 390 can be formed in any suitable manner, including those that are conventional to semiconducting manufacturing technologies. As examples, shallow trench isolation structures 390 can be formed utilizing one or more of a lithography process, an etch process, a deposition process, an oxide growth process, and a polish process.

Figure 11:
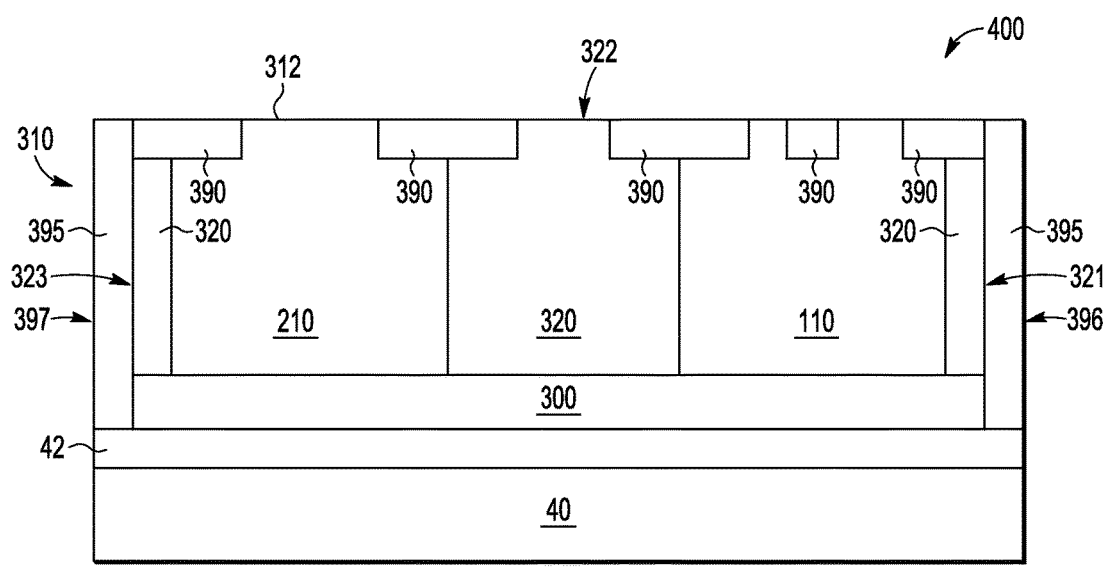
FIG. 11 is a schematic cross-sectional view of a step in a process flow for fabricating ESD protection devices.

As illustrated in FIG. 11, process flow 400 also can include forming a plurality of deep trench isolation structures 395. Formation of the deep trench isolation structures is optional, and examples of ESD protection devices 90 that do not include deep trench isolation structures 395 are illustrated in FIGS. 18 and 20 and discussed in more detail herein with reference thereto.

When process flow 400 includes forming the deep trench isolation structures, deep trench isolation structures 395 can extend from upper surface 312 of overlying layer 310, through sinker well 320, and into contact with buried oxide layer 42. As such, deep trench isolation structures 395 can provide lateral electrical isolation for first bipolar device region 110, second bipolar device region 210, and sinker well 320.

As illustrated, a first portion 396 of deep trench isolation structure 395 can extend within first portion 321 of sinker well 320 such that the first portion of the sinker well separates first bipolar device region 110 from the first portion of the deep trench isolation structure. In addition, a second portion 397 of deep trench isolation structure 395 can extend within third portion 323 of sinker well 320 such that the third portion of the sinker well separates second bipolar device region 210 from the second portion of the deep trench isolation structure.

Deep trench isolation structures can be formed by forming a deep trench within overlying layer 310 or within sinker well 320 and subsequently filling the deep trench with dielectric material. Deep trench isolation structures 395 can be formed in any suitable manner, including those that are conventional to semiconducting manufacturing technologies. As examples, deep trench isolation structures 395 can be formed utilizing one or more of a lithography process, an etch process, a deposition process, an oxide growth process, and a polish process. In FIG. 11, deep trench isolation structures 395 are illustrated as distinct from shallow trench isolation structures 390; however, the deep trench isolation structures can be formed concurrently, or at least partially concurrently, with formation of the shallow trench isolation structures. As an example, the same step can be utilized to fill both the shallow trench isolation structures and the deep trench isolation structures with dielectric material.

Figure 12:
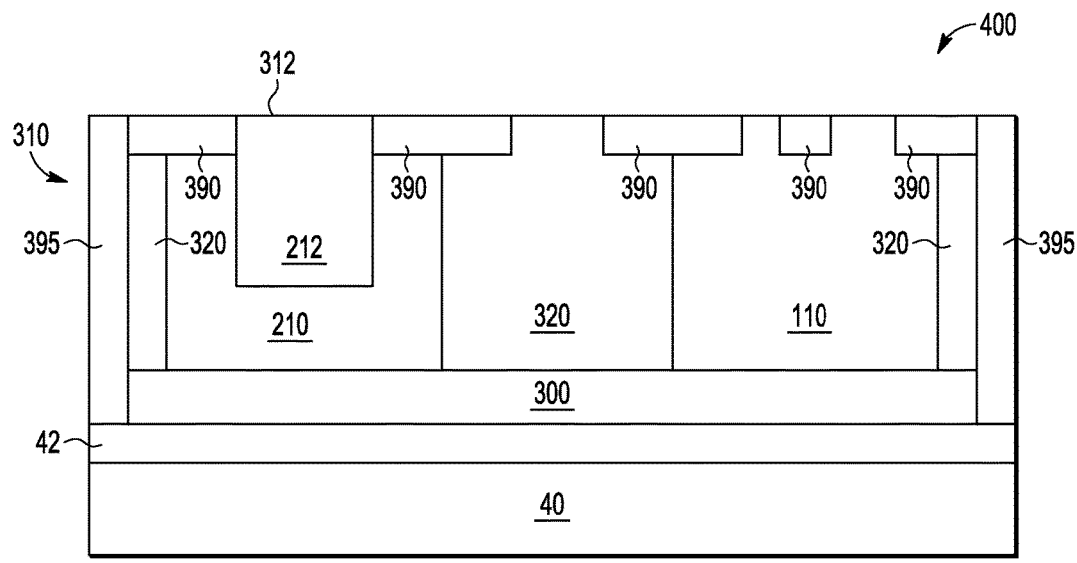
FIG. 12 is a schematic cross-sectional view of a step in a process flow for fabricating ESD protection devices.

As illustrated in FIG. 12, process flow 400 further can include forming a second device well 212 within second bipolar device region 210. Second device well 212 can have the second conductivity type. Second device well 212 can extend from upper surface 312 to any suitable depth within second bipolar device region 210. As examples, the second device well can have a minimum depth of 0.3 micrometers and a maximum depth that is less than the depth of second bipolar device region 210. Stated another way, second device well 212 generally does not extend into direct contact with buried semiconducting layer 300.

Second device well 212 can have a second well peak doping concentration that is greater than the second device region peak doping concentration. As examples, the second well peak doping concentration can be 1E16 $cm^{-3}$ to 2E17 $cm^{-3}$; however, this specific concentration range is not required. In one specific embodiment, second device well 212 can be P-type and can be doped with boron.

Second device well 212 can be formed in any suitable manner, including those that are conventional to semiconductor manufacturing technologies. As examples, second device well 212 can be formed utilizing one or more of a lithography process, an implant process, a diffusion process, or an annealing process.

Figure 13:
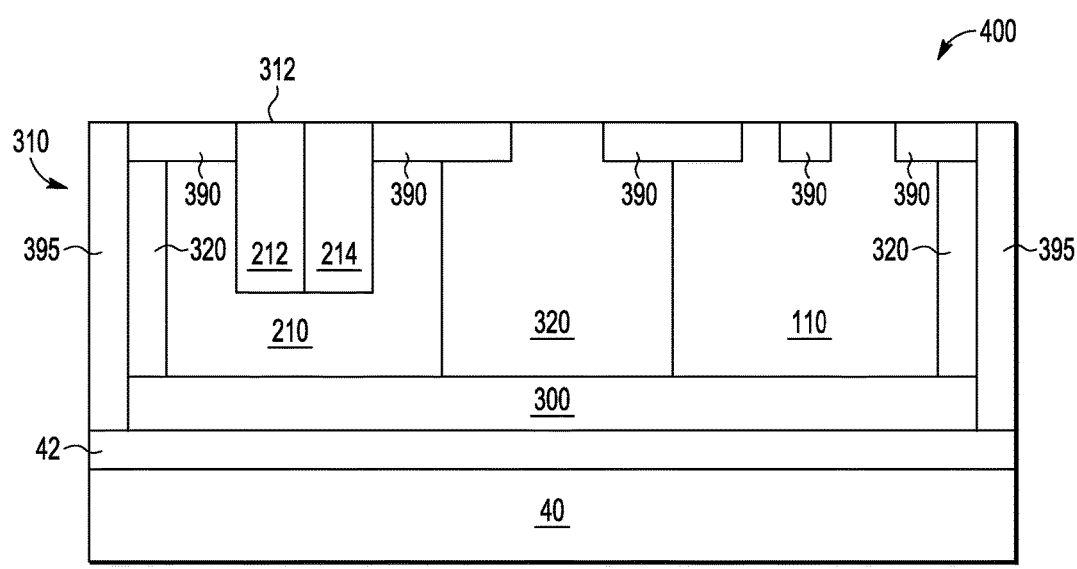
FIG. 13 is a schematic cross-sectional view of a step in a process flow for fabricating ESD protection devices.
Figure 18:
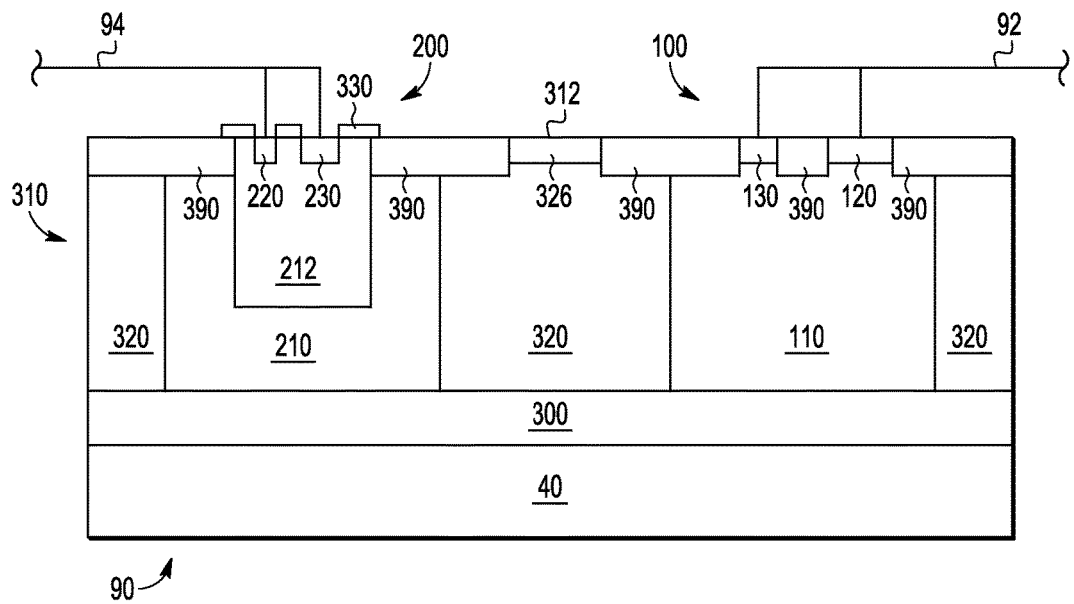
FIG. 18 is a schematic cross-sectional view of an ESD protection device.
Figure 19:
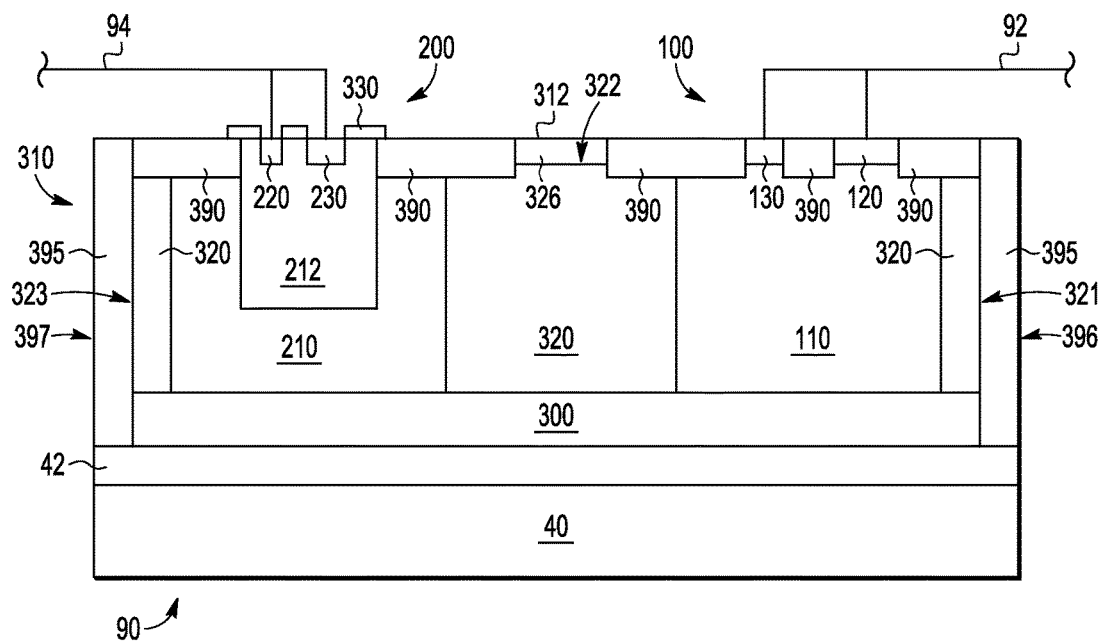
FIG. 19 is a schematic cross-sectional view of an ESD protection device.

As illustrated in FIG. 13, process flow 400 can include forming a second well region 214 within second bipolar device region 210. Second well region 214 can have the second conductivity type. Formation of the second well region is optional, and examples of ESD protection devices 90 that do not include second well region 214 are illustrated in FIGS. 18-19 and discussed in more detail herein with reference thereto.

When process flow 400 includes forming second well region 214, second device well 212 also can be referred to herein as a first well region 212. As illustrated, second well region 214 can extend between, separate, or at least partially separate, first device well 212 from first bipolar device region 110.

Second well region 214 can extend from upper surface 312 to any suitable depth within second bipolar device region 210. As examples, the second well region can have a minimum depth of 0.3 micrometers and a maximum depth that is less than the depth of second bipolar device region 210. Stated another way, second well region 214 generally does not extend into direct contact with buried semiconducting layer 300.

First well region 212 can have a first well region peak doping concentration, and second well region 214 can have a second well region peak doping concentration that is greater than the first well region peak doping concentration. Examples of the first well region peak doping concentration are discussed herein with reference to the second well region peak doping concentration. Examples of the second well region peak doping concentration include concentrations of approximately 4E17 $cm^{-3}$; however, this specific peak doping concentration is not required. In one specific example, second well region 214 can be P-type and can be doped with boron.

Second well region 214 can be formed in any suitable manner, including those that are conventional to semiconductor manufacturing technologies. As examples, second well region 214 can be formed utilizing one or more of a lithography process, an implant process, a diffusion process, or an annealing process.

Figure 14:
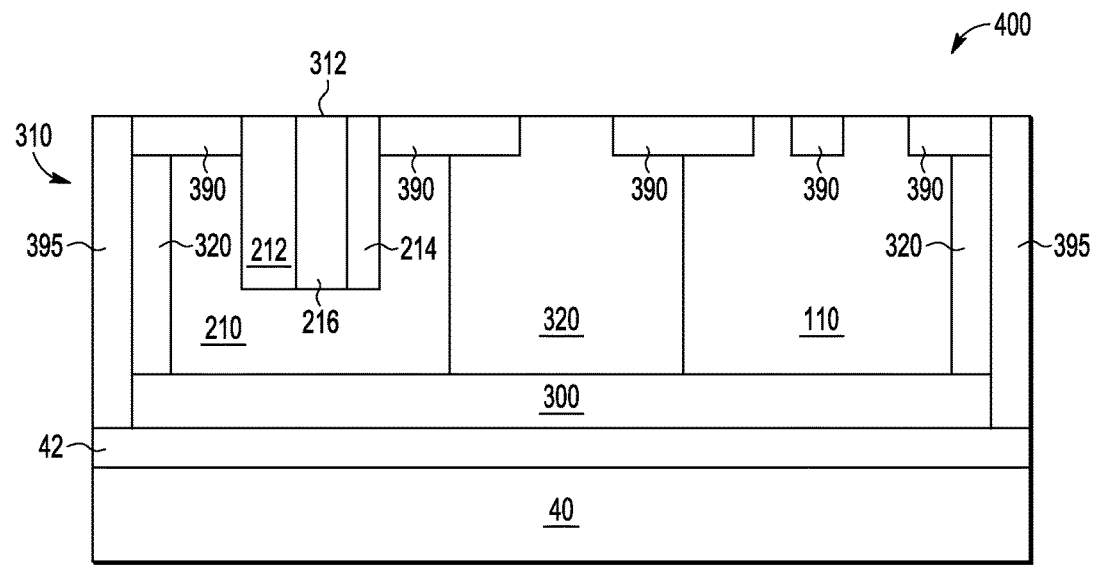
FIG. 14 is a schematic cross-sectional view of a step in a process flow for fabricating ESD protection devices.

As illustrated in FIG. 14, process flow 400 further can include forming a third well region 216 within second bipolar device region 210. Third well region 216 can have the second conductivity type. Formation of the third well region is optional, and examples of ESD protection devices 90 that do not include third well region 216 are illustrated in FIGS. 18-21 and discussed in more detail herein with reference thereto.

When process flow 400 includes forming third well region 216, the third well region can extend between, separate, or at least partially separate, second well region 214 and first well region 212. Additionally or alternatively, second well region 214 can extend between, separate, or at least partially separate, third well region 216 from first bipolar device region 110.

Third well region 216 can extend from upper surface 312 to any suitable depth within second bipolar device region 210. As examples, the third well region can have a minimum depth of 0.3 micrometers and a maximum depth that is less than the depth of second bipolar device region 210. Stated another way, third well region 216 generally does not extend into direct contact with buried semiconducting layer 300.

Third well region 216 can have a third well region peak doping concentration that is greater than the first well region peak doping concentration and that is also greater than the second well region peak doping concentration. In one specific example, third well region 216 can be P-type and can be doped with boron.

Third well region 216 can be formed in any suitable manner, including those that are conventional to semiconductor manufacturing technologies. As examples, third well region 216 can be formed utilizing one or more of a lithography process, an implant process, a diffusion process, or an annealing process.

Figure 15:
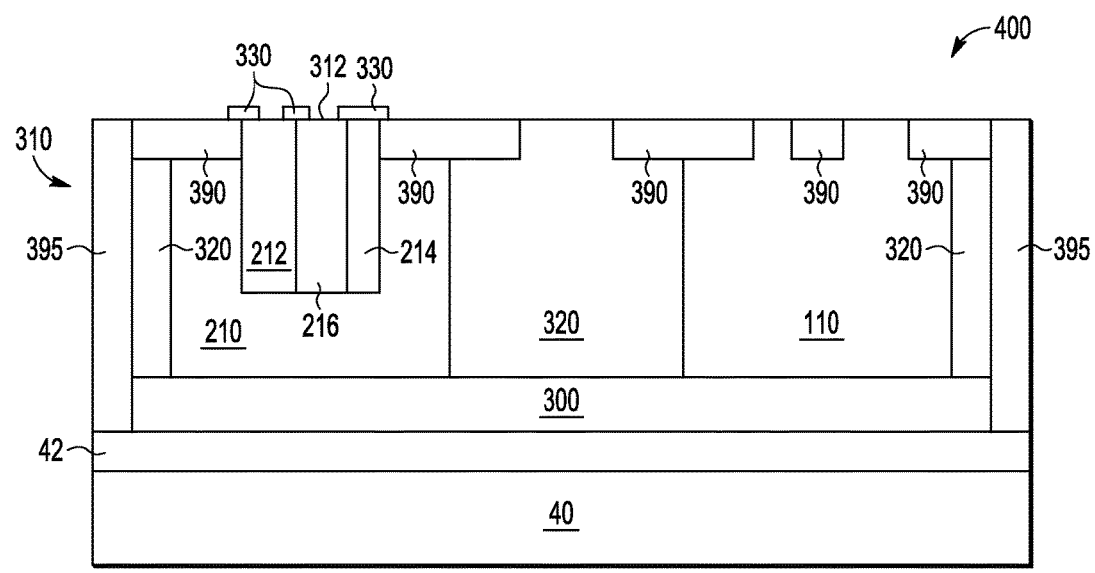
FIG. 15 is a schematic cross-sectional view of a step in a process flow for fabricating ESD protection devices.

As illustrated in FIG. 15, process flow 400 also can include forming a masking layer 330. Masking layer 330 can be lithographically defined, can extend across at least a portion of upper surface 312 (i.e., portions of overlying layer 310 that are not covered by shallow trench isolation structures 390), can extend across at least a portion of second bipolar device region 210, or can be utilized as a mask for subsequent processing steps. In one example, masking layer 330 is a silicon nitride layer that is formed on top of a thin oxide layer; however, other masking materials can be utilized. As an example, shallow trench isolation structure 390 can be utilized as, or function as, masking layer 330. As another example, masking layer 330 can include a silicide.

Masking layer 330 can be formed in any suitable manner, including those that are conventional to semiconductor manufacturing technologies. As examples, masking layer 330 can be formed utilizing one or more of a deposition process, a diffusion process, a lithographic process, and an etch process.

Figure 16:
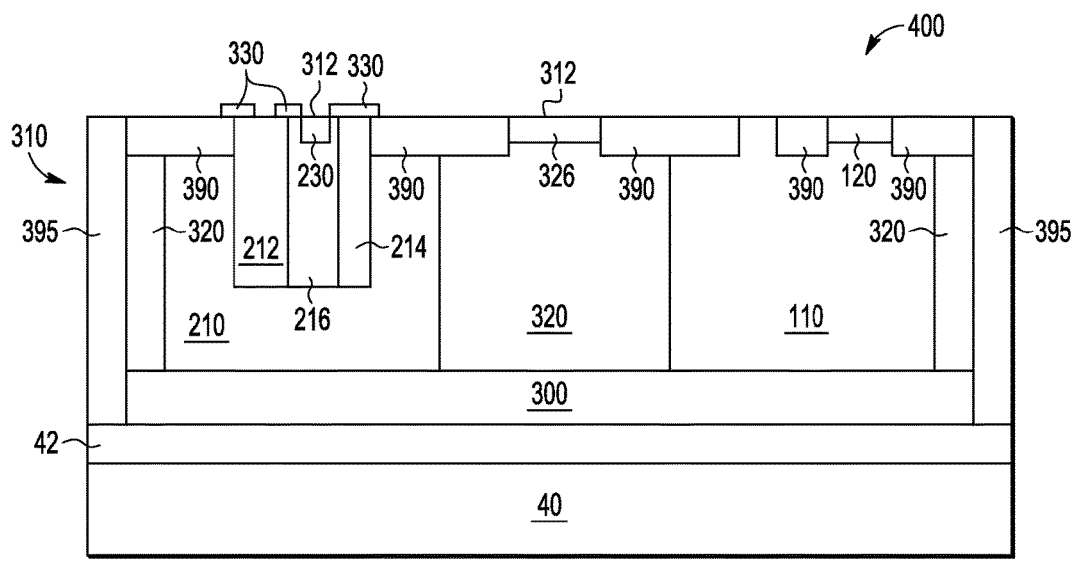
FIG. 16 is a schematic cross-sectional view of a step in a process flow for fabricating ESD protection devices.

As illustrated in FIG. 16, process flow 400 further can include forming a first device base region 120, forming a second device emitter region 230, or forming a sinker well contact 326. The first device base region, the second device emitter region, and the sinker well contact can be formed simultaneously; however, this is not required. As an example, process flow 400 can include masking portions of upper surface 312 that do not extend above first device base region 120, second device emitter region 230, or sinker well contact 326 and subsequently doping respective portions of the first bipolar device region, the sinker well, and of the second bipolar device region to form the first device base region, the sinker well contact, and the second device emitter region, respectively.

First device base region 120 has the first conductivity type and a first base region peak doping concentration. In addition, first device base region 120 extends from upper surface 312 of overlying layer 310 and into, or within, first bipolar device region 110. Second device emitter region 230 has the first conductivity type and a second emitter region peak doping concentration. In addition, second device emitter region 230 extends from upper surface 312 of overlying layer 310 and into, or within, third well region 216. Sinker well contact 326 has the first conductivity type and a sinker well contact peak doping concentration. In addition, sinker well contact 326 extends from upper surface 312 of overlying layer 310 and into, or within, sinker well 320.

The first base region peak doping concentration, the second emitter region peak doping concentration, and the sinker well contact peak doping concentration are greater than the sinker well peak doping concentration. Examples of the first base region peak doping concentration, the second emitter region peak doping concentration, and the sinker well contact peak doping concentration include concentrations of $5E19$ $cm^{-3}$ to $1E21$ $cm^{-3}$; however, this specific concentration range is not required. In one specific example, the first device base region, the second device emitter region, and the sinker well contact can be N-type and can be doped with phosphorous or arsenic. The first device base region, the second device emitter region, and the sinker well contact can extend to any suitable depth within overlying layer 310. As an example, the depth can be from 0.05 micrometers to 0.3 micrometers; however, this specific depth range is not required.

First device base region 120, second device emitter region 230, and sinker well contact 326 can be formed in any suitable manner, including those that are conventional to semiconductor manufacturing technologies. As examples, first device base region 120, second device emitter region 230, and sinker well contact 236 can be formed utilizing one or more of a lithography process, an etch process, an implant process, a diffusion process, or an annealing process.

Figure 17:
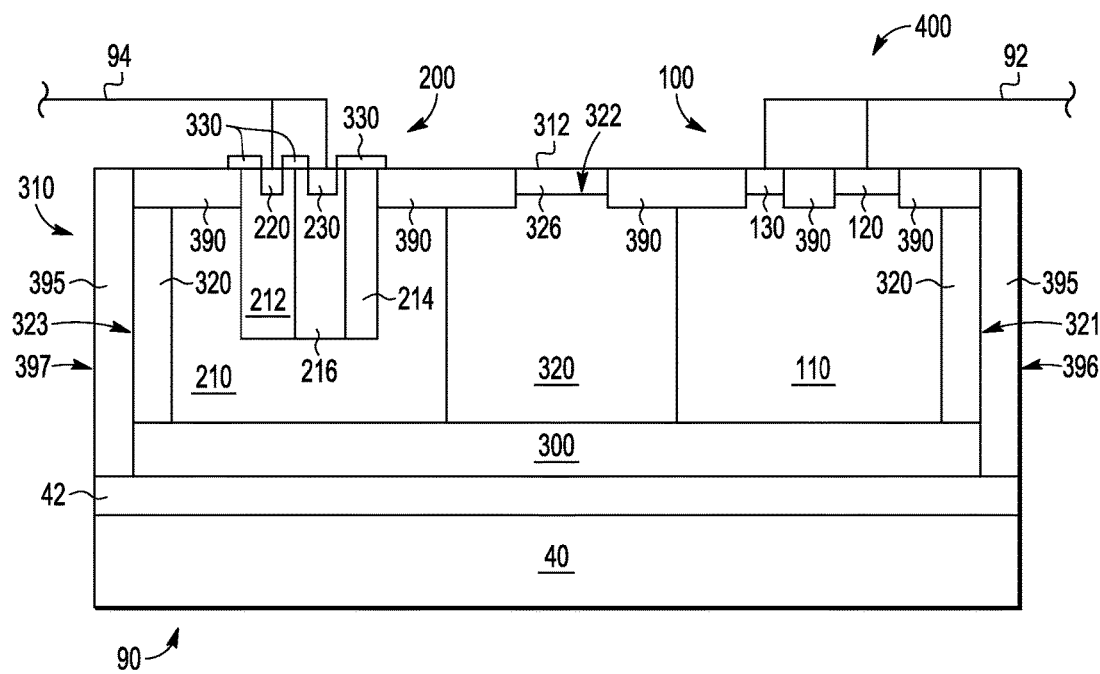
FIG. 17 is a schematic cross-sectional view of a step in a process flow for fabricating ESD protection devices.

As illustrated in FIG. 17, process flow 400 further can include forming a first device emitter region 130 and a second device base region 220. The first device emitter region and the second device base region can be formed simultaneously; however, this is not required. As an example process flow 400 can include masking portions of upper surface 312 that do not extend above first device emitter region 130 or second device base region 220 and subsequently doping respective portions of the first bipolar device region and of the second bipolar device region to form the first device emitter region and the second device base region, respectively.

First device emitter region 130 has the second conductivity type and a first emitter region peak doping concentration. In addition, first device emitter region 130 extends from upper surface 312 of overlying layer 310 and into, or within, first bipolar device region 110. Second device base region 220 has the second conductivity type and a second base region peak doping concentration. In addition, second device base region 220 extends from upper surface 312 of overlying layer 310 and into, or within, first well region 212, which also can be referred to herein as the second device well 212.

As illustrated in FIG. 17, first device base region 120 and first device emitter region 130 are formed such that a distance between the first device emitter region and second device 200 is less than a distance between the first device base region and second device 200. In addition, second device base region 220, and second device emitter region 230 are formed such that a distance between the second device emitter region and first device 100 is less than a distance between the second device base region and first device 100.

The first emitter region peak doping concentration and the second base region peak doping concentrations are greater than the second well peak doping concentration. Examples of the first emitter region peak doping concentration and the second base region peak doping concentration include concentrations of $5E19$ $cm^{-3}$ to $1E21$ $cm^{-3}$; however, this specific concentration range is not required. In one specific example, the first device emitter region and the second device base region can be P-type and can be doped with boron. First device emitter region 130 and second device base region 220 can extend to any suitable depth within overlying layer 310. As an example, the depth can be from 0.05 micrometers to 0.3 micrometers; however, this specific depth range is not required.

First device emitter region 130 and second device base region 220 can be formed in any suitable manner, including those that are conventional to semiconductor manufacturing technologies. As examples, first device emitter region 130 and second device base region 220 can be formed utilizing one or more of a lithography process, an etch process, an implant process, a diffusion process, or an annealing process.

The steps of process flow 400 that are illustrated in FIGS. 5-17 can be utilized to form, or define, an ESD protection device 90 that includes a first bipolar device 100 and a second bipolar device 200, as illustrated in FIG. 17. ESD protection device 90 includes an on state, in which electric current flow from first device emitter region 130 to second device emitter region 230, via sinker well 320, is permitted. ESD protection device 90 also includes an off state, in which electric current flow from the first device emitter region to the second device emitter region, via the sinker well, is restricted. In addition, ESD protection device 90 is configured to transition from the off state to the on state responsive to receipt of greater than a threshold ESD voltage by first device base region 120.

As also discussed, several of the illustrated steps of process flow 400 are optional. As such, FIG. 17 illustrates one example of ESD protection devices 90, and other ESD protection devices 90 also are within the scope of embodiments of the present invention. As an example, the ESD protection device of FIG. 17 is not required to include deep trench isolation structure 395. As another example, the ESD protection device of FIG. 17 is not required to include buried oxide layer 42. As yet another example, the ESD protection device of FIG. 17 is not required to include third well region 216. As another example, the ESD protection device of FIG. 17 is not required to include second well region 214.

Examples of additional, or alternative, ESD protection devices 90, which can be formed utilizing modified versions of process flow 400, are illustrated in FIGS. 18-22 and discussed in more detail herein. FIGS. 1 and 4-22 utilize like numerals to denote like structures. As such, any of the properties, compositions, concentrations, methods of forming, functions, or geometric details that are discussed herein with reference to any one of FIGS. 1 and 4-22 can be utilized with any other of FIGS. 1 and 4-22, where appropriate, without departing from the scope of embodiments of the present invention.

As illustrated in FIGS. 17-22 and discussed in more detail herein, ESD protection devices 90 can include an anode electrical connection 92 and a cathode electrical connection 94. Anode electrical connection 92 can electrically interconnect, directly electrically interconnect, or short, a first device base region 120 and a first device emitter region 130. Similarly, cathode electrical connection 94 can electrically interconnect, directly electrically interconnect, or short, a second device base region 220 and a second device emitter region 230.

As also illustrated in FIGS. 17-22, ESD protection devices 90 include a semiconductor substrate 40 and a buried semiconducting layer 300, which is supported by the semiconductor substrate and has a first conductivity type. ESD protection devices 90 also include an overlying semiconducting layer 310 that is supported by the buried semiconducting layer such that the buried semiconducting layer extends between the overlying semiconducting layer and the semiconductor substrate or electrically separates the buried semiconducting layer from the semiconductor substrate.

ESD protection devices 90 further include a first bipolar device 100 and a second bipolar device 200. First bipolar device 100 includes a first bipolar device region 110 that extends within overlying semiconducting layer 310 and has the first conductivity type. First bipolar device 100 also includes first device base region 120, which extends within the first bipolar device region and has the first conductivity type, and first device emitter region 130, which extends within the first bipolar device region and has the second conductivity type.

Second bipolar device 200 includes a second bipolar device region 210 that extends within overlying semiconducting layer 310 and has the second conductivity type. Second bipolar device 200 also includes a second device well 212, which also can be referred to herein as a first well region 212, extends within the second bipolar device region, and has the second conductivity type. Second bipolar device 200 further includes second device base region 220, which extends within the second device well and has the second conductivity type, and second device emitter region 230, which extends within the second device well and has the first conductivity type.

ESD protection devices 90 also include a sinker well 320 that has the first conductivity type. Sinker well 320 extends within overlying semiconducting layer 310 and electrically separates first bipolar device region 100 from second bipolar device region 200.

As illustrated in FIGS. 17, 19, and 21-22, ESD protection devices 90 can include a buried oxide layer 42 that extends between semiconductor substrate 40 and buried semiconducting layer 300, that separates semiconductor substrate 40 from buried semiconducting layer 300, or that electrically insulates, or isolates, semiconductor substrate 40 from buried semiconducting layer 300. However, and as illustrated in FIGS. 18 and 20 and discussed herein, ESD protection device 90 is not required to include the buried oxide layer.

As also illustrated in FIGS. 17, 19, and 21-22, ESD protection devices 90 can include a deep trench isolation structure 395 that extends through sinker well 320 and into contact with buried oxide layer 42, when present. Deep trench isolation structure 395, when present, includes a first portion 396 and a second portion 397. As discussed herein, first portion 396 of deep trench isolation structure 395 extends within a first portion 321 of sinker well 320 such that the first portion of the sinker well separates the first bipolar device region from the first portion of the deep trench isolation structure. In addition, second portion 397 of deep trench isolation structure 395 extends within a third portion 323 of sinker well 320 such that the third portion of the sinker well separates the second bipolar device region from the second portion of the deep trench isolation structure. Deep trench isolation structure 395 can be a single, or unitary, structure that extends around the first bipolar device region and defines first portion 396 and second portion 397. However, and as illustrated in FIGS. 18 and 20 and discussed herein, ESD protection devices 90 are not required to include the deep trench isolation structure.

FIGS. 18-19 are schematic cross-sectional views of ESD protection devices 90 that are similar to ESD protection device 90 of FIG. 17. However, in FIGS. 18-19, second bipolar device 200 includes a second device well 212 (e.g., a first well region 212) but does not include second well region 214 or third well region 216 of ESD protection device 90 of FIG. 17. As such, both second device base region 220 and second device emitter region 230 extend within second device well 212.

In ESD protection devices 90 of FIGS. 18-19, second device well 212 can have a second device well peak doping concentration that is comparable to the second well region peak doping concentration of second well region 214 of FIGS. 17 and 20-22. Thus, and when process flow 400 is modified to form ESD protection devices 90 of FIGS. 18-19, formation of the second device well, which is illustrated in FIG. 12, can include forming the second device well with the second device well peak doping concentration. Examples of the second device well peak doping concentration include concentrations of approximately $4E17$ $cm^{-3}$; however, this specific peak doping concentration is not required.

Figure 21:
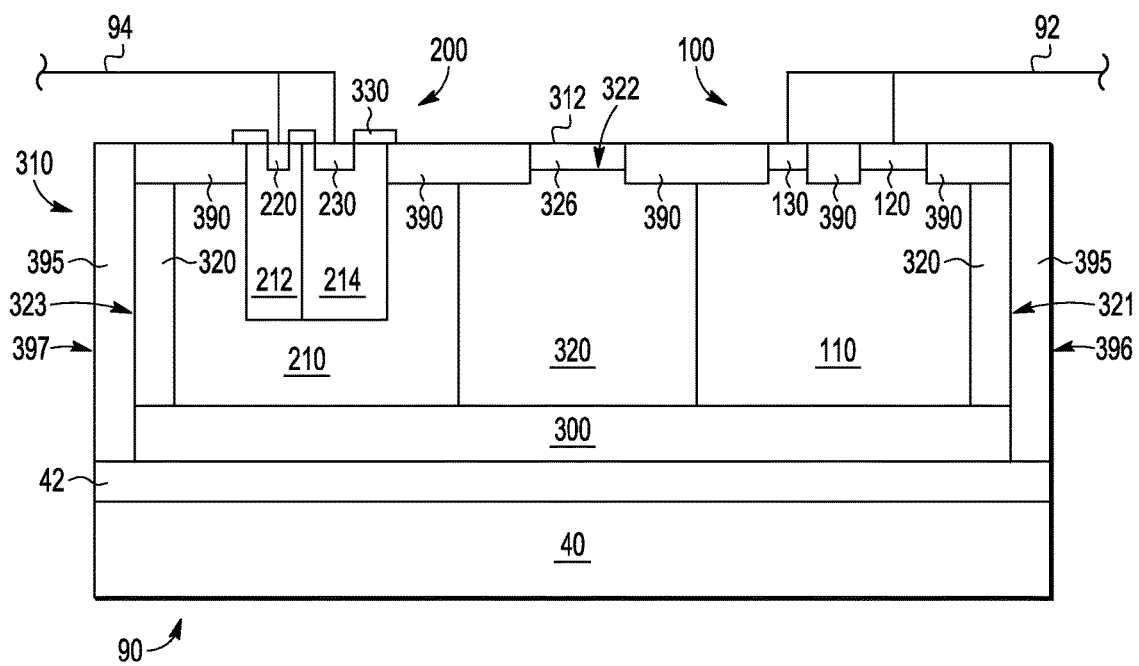
FIG. 21 is a schematic cross-sectional view of an ESD protection device.

FIGS. 20-21 are schematic cross-sectional views of ESD protection devices 90 that are similar to ESD protection devices 90 of FIGS. 17-19. However, in FIGS. 20-21, second bipolar device 200 includes a first well region 212 and a second well region 214 but does not include third well region 216 of ESD protection device 90 of FIG. 17. In the example of FIGS. 20-21, second device base region 220 extends within first well region 212, while second device emitter region 230 extends within second well region 214. Such a structure can be formed by skipping the steps of process flow 400 of FIGS. 5-17 that are utilized to form third well region 216, such as the steps of process flow 400 that are illustrated in FIGS. 13-14.

Figure 22:
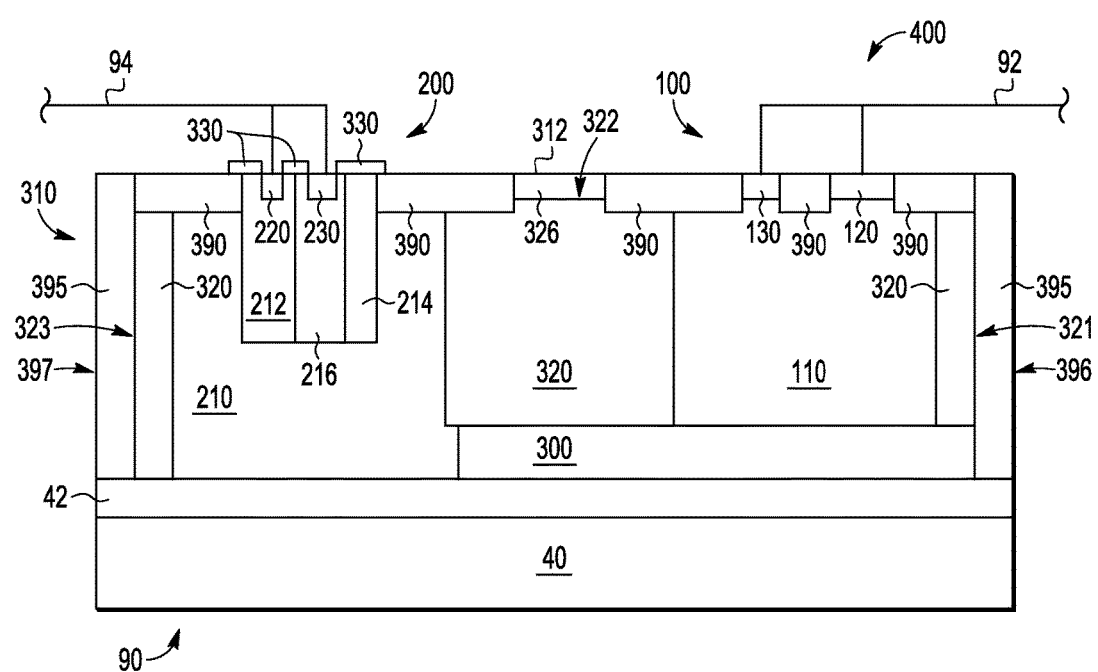
FIG. 22 is a schematic cross-sectional view of an ESD protection device.

FIG. 22 is a schematic cross-sectional view of an ESD protection device 90 that is similar to ESD protection devices 90 of FIGS. 17-21. However, in FIG. 22, buried semiconducting layer 300 does not extend between second bipolar device region 210 and buried oxide layer 42. Stated another way, and in ESD protection device 90 of FIG. 22, second bipolar device region 210 extends into contact with buried oxide layer 42 or extends from upper surface 321 to buried oxide layer 42. As also illustrated in FIG. 22, second bipolar device region 210 can extend at least partially under the portion of sinker well 320 that extends between first bipolar device region 110 and second bipolar device region 210. Such a configuration can provide improved holding voltage ($V_H$) characteristics for ESD protection device 90 of FIG. 22.

ESD protection device 90 of FIG. 22 can be formed through modification of process flow 400 of FIGS. 5-17. As an example, EPI seed layer 44 may not be converted to buried semiconducting layer 300 (as illustrated in FIGS. 5-6) in regions of EPI seed layer 44 that will extend below second bipolar device region 210. As another example, formation of second bipolar device region 210, which is illustrated in FIGS. 8-9, can include forming the second bipolar device region such that the second bipolar device region extends between upper surface 312 and buried oxide layer 42.

Although the invention is described herein with reference to specific embodiments, various modifications and changes can be made without departing from the scope of the present invention as set forth in the claims below. For example, and as discussed, one or more steps of process flow 400 can be omitted to fabricate different, but functionally similar, ESD protection devices 90. Accordingly, the specification and Figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any of the claims.

Unless stated otherwise, terms such as "first" and "second" are used to arbitrarily distinguish between the elements such terms describe. Thus, these terms are not necessarily intended to indicate temporal or other prioritization of such elements.

As used herein the terms "adapted" and "configured" mean that the element, component, or other subject matter is designed, or intended, to perform a given function. Thus, the use of the terms "adapted" and "configured" should not be construed to mean that a given element, component, or other subject matter is simply "capable of" performing a given function but that the element, component, or other subject matter is specifically selected, created, implemented, utilized, programmed, or designed for the purpose of performing the function. It is also within the scope of embodiments of the present invention that elements, components, or other recited subject matter that is recited as being adapted to perform a particular function may additionally or alternatively be described as being configured to perform that function, and vice versa.

As used herein, the term "or" should be interpreted as being inclusive or exclusive. For example, "A or B" can be interpreted to mean A, B, or both A and B.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of embodiments of the present invention.

The following are various embodiments of the present invention.

In a first embodiment, there is provided an electrostatic discharge (ESD) protection device. The ESD protection device includes a semiconductor substrate. The ESD protection device includes a buried semiconducting layer. The buried semiconducting layer is supported by the semiconductor substrate and has a first conductivity type. The ESD protection device includes an overlying semiconducting layer supported by the buried semiconducting layer. The buried semiconducting layer extends between the overlying semiconducting layer and the semiconductor substrate.

The ESD protection device includes a first bipolar device. The first bipolar device includes a first bipolar device region, which extends within the overlying semiconducting layer and has the first conductivity type. The first bipolar device includes a first device base region. The first bipolar device region extends within the first bipolar device region and has the first conductivity type. The first bipolar device includes a first device emitter region, which extends within the first bipolar device region and has a second conductivity type that is different from the first conductivity type.

The ESD protection device includes a second bipolar device. The second bipolar device includes a second bipolar device region. The second bipolar device region extends within the overlying semiconducting layer and has the second conductivity type. The second bipolar device includes a second device well. The second device well extends within the second bipolar device region and has the second conductivity type. The second bipolar device includes a second device base region. The second device base region extends within the second device well and has the second conductivity type. The second bipolar device includes a second device emitter region. The second device emitter region extends within the second device well and has the first conductivity type.

The ESD protection device includes a sinker well. The sinker well extends within the overlying semiconducting layer. The sinker well has the first conductivity type. The sinker well is configured to electrically separate the first bipolar device region from the second bipolar device region.

The ESD protection device is configured to provide an off state, in which electric current flow from the first device emitter region to the second device emitter region via the sinker well is restricted. The ESD protection device is configured to provide an on state, in which electric current flow from the first device emitter region to the second device emitter region via the sinker well is permitted. The ESD protection device is configured to transition from the off state to the on state in response to receipt of greater than a threshold ESD voltage by the first device base region.

The ESD protection device can include an anode electrical connection and a cathode electrical connection. The anode electrical connection can electrically interconnect the first device base region with the first device emitter region. The cathode electrical connection can electrically interconnect the second device base region with the second device emitter region.

A distance between the first device emitter region and the second bipolar device can be less than a distance between the first device base region and the second bipolar device. A distance between the second device emitter region and the first bipolar device can be less than a distance between the second device base region and the first bipolar device.

The ESD protection device can include a buried oxide layer. The buried oxide layer can be supported by the semiconductor substrate. The buried oxide layer can electrically insulate the buried semiconducting layer from the semiconductor substrate.

The sinker well can extend around the first bipolar device region such that the first bipolar device region separates a first portion of the sinker well from a second portion of the sinker well. The sinker well can extend around the second bipolar device region such that the second bipolar device region separates the second portion of the sinker well from a third portion of the sinker well.

The ESD protection device can include a deep trench isolation structure. The deep trench isolation structure can extend through the sinker well and into contact with the buried oxide layer. A first portion of the deep trench isolation structure can extend within the first portion of the sinker well such that the first portion of the sinker well separates the first bipolar device region from the first portion of the deep trench isolation structure. A second portion of the deep trench isolation structure can extend within the third portion of the sinker well such that the third portion of the sinker well separates the second bipolar device region from the second portion of the deep trench isolation structure.

The second device well can include a first well region and a second well region. The first well region can have a first well region peak doping concentration. The second well region can have a second well region peak doping concentration. The second well region peak doping concentration can be greater than the first well region peak doping concentration. The second device base region can extend within the first well region. The second device emitter region can extend within the second well region. The second device well can include a third well region. The third well region can have a third well region peak doping concentration that is greater than the second well region peak doping concentration. The second device emitter region can extend within the third well region. The third well region can separate the first well region from the second well region. The buried semiconducting layer can have a buried layer peak doping concentration.

The first bipolar device region can have a first device region peak doping concentration. The first device base region can have a first base region peak doping concentration. The first device emitter region can have a first emitter region peak doping concentration. The second bipolar device region can have a second device region peak doping concentration. The second device well can have a second well peak doping concentration. The second device base region can have a second base region peak doping concentration. The second device emitter region can have a second emitter region peak doping concentration. The sinker well can have a sinker well peak doping concentration. The buried layer peak doping concentration and the sinker well peak doping concentration can be greater than the first device region peak doping concentration. The first base region peak doping concentration and the second emitter region peak doping concentration can be greater than the buried layer peak doping concentration. The first base region peak doping concentration and the second emitter region peak doping concentration can be greater than the sinker well peak doping concentration. The second well peak doping concentration can be greater than the second device region peak doping concentration. The first emitter region peak doping concentration and the second base region peak doping concentration can be greater than the second well peak doping concentration.

The first conductivity type can be N-type. The second conductivity type can be P-type.

In a second embodiment, there is provided a method of forming an electrostatic discharge (ESD) protection device. The method includes forming a first device base region within a first bipolar device region. The first device base region has a first conductivity type. The first bipolar device region has the first conductivity type. The first bipolar device region extends within an overlying semiconducting layer. The overlying semiconducting layer is supported by a buried semiconducting layer. The buried semiconducting layer has the first conductivity type. The buried semiconducting layer is supported by a semiconductor substrate. The buried semiconducting layer electrically separates the overlying semiconducting layer from the semiconductor substrate.

The method includes forming a first device emitter region within the first bipolar device region. The first device emitter region has a second conductivity type. The second conductivity type is different from the first conductivity type.

The method includes forming a second device well within a second bipolar device region. The second device well has the second conductivity type. The second bipolar device region has the second conductivity type. The second bipolar device region extends within the overlying semiconducting layer.

The method includes forming a second device base region within the second device well. The second device base region has the second conductivity type.

The method includes forming a second device emitter region within the second device well. The second device emitter region has the first conductivity type.

The method includes forming a sinker well within the overlying semiconducting layer. The sinker well has the first conductivity type. The sinker well electrically separates the second bipolar device region from the first bipolar device region.

The method can include forming the first device base region and forming the first device emitter region such that a distance between the first device emitter region and the second bipolar device region is less than a distance between the first device base region and the second bipolar device region. The method can include forming the second device base region and forming the second device emitter region such that a distance between the second device emitter region and the first bipolar device region is less than a distance between the second device base region and the first bipolar device region.

The first bipolar device region can have a first device region peak doping concentration. The forming the first device base region can include forming the first device base region with a first base region peak doping concentration. The forming the first device emitter region can include forming the first device emitter region with a first emitter region peak doping concentration. The forming the sinker well can include forming the sinker well with a sinker well peak doping concentration. The forming the second device well can include forming the second device well with a second well peak doping concentration. The forming the second device base region can include forming the second device base region with a second base region peak doping concentration. The forming the second device emitter region can include forming the second device emitter region with a second emitter region peak doping concentration. The sinker well peak doping concentration can be greater than the first device region peak doping concentration. The first base region peak doping concentration and the second emitter region peak doping concentration can be greater than the sinker well peak doping concentration. The second well peak doping concentration can be greater than the second device region peak doping concentration. The first emitter region peak doping concentration and the second base region peak doping concentration can be greater than the second well peak doping concentration.

The method can include forming the overlying semiconducting layer on the buried semiconducting layer such that the overlying semiconducting layer is supported by the buried semiconducting layer. The method can include forming the overlying semiconducting layer on the buried semiconducting layer such that the buried semiconducting layer electrically separates the overlying semiconducting layer from the semiconductor substrate. The method can include, prior to the forming the overlying semiconducting layer, forming the buried semiconducting layer such that the buried semiconducting layer is supported by the semiconductor substrate.

A buried oxide layer can be supported by the semiconductor substrate. The buried oxide layer can separate the buried semiconducting layer from the semiconductor substrate. The buried oxide layer can electrically insulate the buried semiconducting layer from the semiconductor substrate. The forming the buried semiconducting layer can include forming the buried semiconducting layer such that the buried semiconducting layer is supported by the buried oxide layer.

The forming the sinker well can include forming the sinker well such that the sinker well extends around the first bipolar device region. The forming the sinker well can include forming the sinker well such that the sinker well extends around the second bipolar device region. The first bipolar device region can separate a first portion of the sinker well from a second portion of the sinker well. The second bipolar device region can separate the second portion of the sinker well from a third portion of the sinker well.

The method can include forming a deep trench isolation structure. The deep trench isolation structure can extend through the sinker well and into contact with the buried oxide layer. A first portion of the deep trench isolation structure can extend within the first portion of the sinker well such that the first portion of the sinker well separates the first bipolar device region from the first portion of the deep trench isolation structure. A second portion of the deep trench isolation structure can extend within the third portion of the sinker well such that the third portion of the sinker well separates the second bipolar device region from the second portion of the deep trench isolation structure.

The forming the second device well can include forming a first well region and a second well region. The first well region can have a first well region peak doping concentration. The second well region can have a second well region peak doping concentration. The second well region peak doping concentration can be greater than the first well region peak doping concentration. The second device base region can extend within the first well region. The second device emitter region can extend within the second well region.

The forming the second device well can include forming a third well region. The third well region can have a third well region peak doping concentration. The third well region peak doping concentration can be greater than the second well region peak doping concentration. The second device emitter region can extend within the third well region. The third well region can separate the first well region from the second well region.

What is claimed is:

1. An electrostatic discharge (ESD) protection device, comprising:
   a semiconductor substrate;
   a buried semiconducting layer that is supported by the semiconductor substrate and has a first conductivity type;
   a buried oxide layer that is supported by the semiconductor substrate, wherein the buried oxide layer electrically insulates the buried semiconducting layer from the semiconductor substrate;
   an overlying semiconducting layer supported by the buried semiconducting layer, wherein the buried semiconducting extends between the overlying semiconducting layer and the semiconductor substrate;
   a first bipolar device comprising
      a first bipolar device region, which extends within the overlying semiconducting layer and has the first conductivity type,
      a first device base region, which extends within the first bipolar device region and has the first conductivity type, and
      a first device emitter region, which extends within the first bipolar device region and has a second conductivity type that is different from the first conductivity type;
   a second bipolar device comprising
      a second bipolar device region, which extends within the overlying semiconducting layer and has the second conductivity type,
      a second device well, which extends within the second bipolar device region and has the second conductivity type, a second device base region, which extends within the second device well and has the second conductivity type, and a second device emitter region, which extends within the second device well and has the first conductivity type;

a sinker well, having the first conductivity type, extending within the overlying semiconducting layer and configured to electrically separate the first bipolar device region from the second bipolar device region, further extending around the first bipolar device region such that the first bipolar device region separates a first portion of the sinker well from a second portion of the sinker well, and further extending around the second bipolar device region such that the second bipolar device region separates the second portion of the sinker well from a third portion of the sinker well, wherein the ESD protection device is configured to provide an off state, in which electric current flow from the first device emitter region to the second device emitter region via the sinker well is restricted, provide an on state, in which electric current flow from the first device emitter region to the second device emitter region via the sinker well is permitted, and transition from the off state to the on state in response to receipt of greater than a threshold ESD voltage by the first device base region; and a deep trench isolation structure that extends through the sinker well and into contact with the buried oxide layer, wherein a first portion of the deep trench isolation structure extends within the first portion of the sinker well such that the first portion of the sinker well separates the first bipolar device region from the first portion of the deep trench isolation structure, and a second portion of the deep trench isolation structure extends within the third portion of the sinker well such that the third portion of the sinker well separates the second bipolar device region from the second portion of the deep trench isolation structure.

2. The ESD protection device of claim 1, further comprising an anode electrical connection and a cathode electrical connection, wherein the anode electrical connection electrically interconnects the first device base region with the first device emitter region, and the cathode electrical connection electrically interconnects the second device base region with the second device emitter region.

3. The ESD protection device of claim 1, wherein (i) a distance between the first device emitter region and the second bipolar device is less than a distance between the first device base region and the second bipolar device; and (ii) a distance between the second device emitter region and the first bipolar device is less than a distance between the second device base region and the first bipolar device.

4. The ESD protection device of claim 1, further comprising a buried oxide layer that is supported by the semiconductor substrate, wherein the buried oxide layer electrically insulates the buried semiconducting layer from the semiconductor substrate.

5. The ESD protection device of claim 4, wherein the sinker well further extends around the first bipolar device region such that the first bipolar device region separates a first portion of the sinker well from a second portion of the sinker well, and the sinker well further extends around the second bipolar device region such that the second bipolar device region separates the second portion of the sinker well from a third portion of the sinker well.

6. The ESD protection device of claim 1, wherein the first conductivity type is N-type and the second conductivity type is P-type.

7. An electrostatic discharge (ESD) protection device, comprising:

a semiconductor substrate;

a buried semiconducting layer that is supported by the semiconductor substrate and has a first conductivity type;

an overlying semiconducting layer supported by the buried semiconducting layer, wherein the buried semiconducting extends between the overlying semiconducting layer and the semiconductor substrate;

a first bipolar device comprising a first bipolar device region, which extends within the overlying semiconducting layer and has the first conductivity type, a first device base region, which extends within the first bipolar device region and has the first conductivity type, and a first device emitter region, which extends within the first bipolar device region and has a second conductivity type that is different from the first conductivity type;

a second bipolar device comprising a second bipolar device region, which extends within the overlying semiconducting layer and has the second conductivity type, a second device well, which extends within the second bipolar device region and has the second conductivity type, wherein the second device well comprises a first well region and a second well region, the first well region has a first well region peak doping concentration, and the second well region has a second well region peak doping concentration that is greater than the first well region peak doping concentration, a second device base region, which extends within the second device well and has the second conductivity type, wherein the second device base region extends within the first well region, and a second device emitter region, which extends within the second device well and has the first conductivity type, wherein the second device emitter region extends within the second well region; and a sinker well, extending within the overlying semiconducting layer, having the first conductivity type, and configured to electrically separate the first bipolar device region from the second bipolar device region, wherein the ESD protection device is configured to provide an off state, in which electric current flow from the first device emitter region to the second device emitter region via the sinker well is restricted, provide an on state, in which electric current flow from the first device emitter region to the second device emitter region via the sinker well is permitted, and transition from the off state to the on state in response to receipt of greater than a threshold ESD voltage by the first device base region.

8. An electrostatic discharge (ESD) protection device, comprising:

a semiconductor substrate;
a buried semiconducting layer that is supported by the semiconductor substrate and has a first conductivity type;
an overlying semiconducting layer supported by the buried semiconducting layer, wherein the buried semiconducting extends between the overlying semiconducting layer and the semiconductor substrate;
a first bipolar device comprising
 a first bipolar device region, which extends within the overlying semiconducting layer and has the first conductivity type,
 a first device base region, which extends within the first bipolar device region and has the first conductivity type, and
 a first device emitter region, which extends within the first bipolar device region and has a second conductivity type that is different from the first conductivity type;
a second bipolar device comprising
 a second bipolar device region, which extends within the overlying semiconducting layer and has the second conductivity type,
 a second device well, which extends within the second bipolar device region and has the second conductivity type, wherein the second device well comprises a first well region, a second well region and a third well region, the first well region has a first well region peak doping concentration, the second well region has a second well region peak doping concentration that is greater than the first well region peak doping concentration, the third well region has a third well region peak doping concentration that is greater than the second well region peak doping concentration, and the third well region separates the first well region from the second well region,
 a second device base region, which extends within the second device well and has the second conductivity type, wherein the second device base region extends within the first well region,
 a second device emitter region, which extends within the second device well and has the first conductivity type, wherein the second device emitter region extends within the third well region; and
a sinker well, extending within the overlying semiconducting layer, having the first conductivity type, and configured to electrically separate the first bipolar device region from the second bipolar device region, wherein the ESD protection device is configured to
provide an off state, in which electric current flow from the first device emitter region to the second device emitter region via the sinker well is restricted,
provide an on state, in which electric current flow from the first device emitter region to the second device emitter region via the sinker well is permitted, and
transition from the off state to the on state in response to receipt of greater than a threshold ESD voltage by the first device base region.

9. An electrostatic discharge (ESD) protection device, comprising:
a semiconductor substrate;
a buried semiconducting layer that is supported by the semiconductor substrate and has a first conductivity type, wherein the buried semiconducting layer has a buried layer peak doping concentration;
an overlying semiconducting layer supported by the buried semiconducting layer, wherein the buried semiconducting extends between the overlying semiconducting layer and the semiconductor substrate;
a first bipolar device comprising
 a first bipolar device region, which extends within the overlying semiconducting layer and has the first conductivity type, wherein the first bipolar device region has a first device region peak doping concentration,
 a first device base region, which extends within the first bipolar device region and has the first conductivity type, wherein the first device base region has a first base region peak doping concentration, and
 a first device emitter region, which extends within the first bipolar device region and has a second conductivity type that is different from the first conductivity type, wherein the first device emitter region has a first emitter region peak doping concentration;
a second bipolar device comprising
 a second bipolar device region, which extends within the overlying semiconducting layer and has the second conductivity type, wherein the second bipolar device region has a second device region peak doping concentration,
 a second device well, which extends within the second bipolar device region and has the second conductivity type, wherein the second device well has a second well peak doping concentration,
 a second device base region, which extends within the second device well and has the second conductivity type, wherein the second device base region has a second base region peak doping concentration, and
 a second device emitter region, which extends within the second device well and has the first conductivity type, wherein the second device emitter region has a second emitter region peak doping concentration; and
a sinker well, extending within the overlying semiconducting layer, having the first conductivity type, and configured to electrically separate the first bipolar device region from the second bipolar device region, wherein the sinker well has a sinker well peak doping concentration, and the ESD protection device is configured to
provide an off state, in which electric current flow from the first device emitter region to the second device emitter region via the sinker well is restricted,
provide an on state, in which electric current flow from the first device emitter region to the second device emitter region via the sinker well is permitted, and
transition from the off state to the on state in response to receipt of greater than a threshold ESD voltage by the first device base region, further wherein
(i) the buried layer peak doping concentration and the sinker well peak doping concentration are greater than the first device region peak doping concentration;
(ii) the first base region peak doping concentration and the second emitter region peak doping concentration are greater than the buried layer peak doping concentration;
(iii) the first base region peak doping concentration and the second emitter region peak doping concentration are greater than the sinker well peak doping concentration;
(iv) the second well peak doping concentration is greater than the second device region peak doping concentration; and (v) the first emitter region peak doping concentration and the second base region peak doping concentration are greater than the second well peak doping concentration.

10. A method of forming an electrostatic discharge (ESD) protection device, the method comprising:
    forming a first device base region that has a first conductivity type within a first bipolar device region that has the first conductivity type, wherein
        the first bipolar device region has a first device region peak doping concentration,
        the first bipolar device region extends within an overlying semiconducting layer that is supported by a buried semiconducting layer that has the first conductivity type,
        the buried semiconducting layer is supported by a semiconductor substrate, and
        the buried semiconducting layer electrically separates the overlying semiconducting layer from the semiconductor substrate, and
        the forming the first device base region comprises forming the first device base region with a first base region peak doping concentration;
    forming a first device emitter region that has a second conductivity type within the first bipolar device region, wherein
        the second conductivity type is different from the first conductivity type, and
        the forming the first device emitter region comprises forming the first device emitter region with a first emitter region peak doping concentration;
    forming a second device well that has the second conductivity type within a second bipolar device region that has the second conductivity type, wherein
        the second bipolar device region extends within the overlying semiconducting layer, and
        the forming the second device well comprises forming the second device well with a second well peak doping concentration;
    forming a second device base region that has the second conductivity type within the second device well, wherein the forming the second device base region comprises forming the second device base region with a second base region peak doping concentration;
    forming a second device emitter region that has the first conductivity type within the second device well, wherein the forming the second device emitter region comprising forming the second device emitter region with a second emitter region peak doping concentration; and
    forming a sinker well that has the first conductivity type within the overlying semiconducting layer such that the sinker well electrically separates the second bipolar device region from the first bipolar device region, wherein the forming the sinker well comprises forming the sinker well with a sinker well peak doping concentration, and further wherein
    (i) the sinker well peak doping concentration is greater than the first device region peak doping concentration;
    (ii) the first base region peak doping concentration and the second emitter region peak doping concentration are greater than the sinker well peak doping concentration;
    (iii) the second well peak doping concentration is greater than the second device region peak doping concentration; and
    (iv) the first emitter region peak doping concentration and the second base region peak doping concentration are greater than the second well peak doping concentration.

11. The method of claim 10, wherein the method comprises
    forming the first device base region and forming the first device emitter region such that a distance between the first device emitter region and the second bipolar device region is less than a distance between the first device base region and the second bipolar device region, and
    forming the second device base region and forming the second device emitter region such that a distance between the second device emitter region and the first bipolar device region is less than a distance between the second device base region and the first bipolar device region.

12. A method of forming an electrostatic discharge (ESD) protection device, the method comprising:
    forming a first device base region that has a first conductivity type within a first bipolar device region that has the first conductivity type, wherein
        the first bipolar device region extends within an overlying semiconducting layer that is supported by a buried semiconducting layer that has the first conductivity type,
        the buried semiconducting layer is supported by a semiconductor substrate,
        the buried semiconducting layer electrically separates the overlying semiconducting layer from the semiconductor substrate,
        said forming the first device base region further comprises forming the overlying semiconducting layer on the buried semiconducting layer such that the overlying semiconducting layer is supported by the buried semiconducting layer and also such that the buried semiconducting layer electrically separates the overlying semiconducting layer from the semiconductor substrate, and
        prior to the forming the overlying semiconducting layer, forming the buried semiconducting layer such that the buried semiconducting layer is supported by the semiconductor substrate;
    forming a first device emitter region that has a second conductivity type within the first bipolar device region, wherein the second conductivity type is different from the first conductivity type;
    forming a second device well that has the second conductivity type within a second bipolar device region that has the second conductivity type, wherein the second bipolar device region extends within the overlying semiconducting layer;
    forming a second device base region that has the second conductivity type within the second device well;
    forming a second device emitter region that has the first conductivity type within the second device well; and
    forming a sinker well that has the first conductivity type within the overlying semiconducting layer such that the sinker well electrically separates the second bipolar device region from the first bipolar device region.

13. The method of claim 12, wherein a buried oxide layer is supported by the semiconductor substrate, separates the buried semiconducting layer from the semiconductor substrate, and electrically insulates the buried semiconducting layer from the semiconductor substrate, and further wherein the forming the buried semiconducting layer comprises forming the buried semiconducting layer such that the buried semiconducting layer is supported by the buried oxide layer.

14. The method of claim 13, wherein the forming the sinker well comprises forming the sinker well such that the sinker well further extends around the first bipolar device region and also such that the sinker well extends around the second bipolar device region, wherein the first bipolar device region separates a first portion of the sinker well from a second portion of the sinker well, and further wherein the second bipolar device region separates the second portion of the sinker well from a third portion of the sinker well.

15. The method of claim 14, the method further comprising forming a deep trench isolation structure such that the deep trench isolation structure extends through the sinker well and into contact with the buried oxide layer, wherein
   a first portion of the deep trench isolation structure extends within the first portion of the sinker well such that the first portion of the sinker well separates the first bipolar device region from the first portion of the deep trench isolation structure, and
   a second portion of the deep trench isolation structure extends within the third portion of the sinker well such that the third portion of the sinker well separates the second bipolar device region from the second portion of the deep trench isolation structure.

16. A method of forming an electrostatic discharge (ESD) protection device, the method comprising:
   forming a first device base region that has a first conductivity type within a first bipolar device region that has the first conductivity type, wherein
      the first bipolar device region extends within an overlying semiconducting layer that is supported by a buried semiconducting layer that has the first conductivity type,
      the buried semiconducting layer is supported by a semiconductor substrate, and
      the buried semiconducting layer electrically separates the overlying semiconducting layer from the semiconductor substrate;
   forming a first device emitter region that has a second conductivity type within the first bipolar device region, wherein the second conductivity type is different from the first conductivity type;
   forming a second device well that has the second conductivity type within a second bipolar device region that has the second conductivity type, wherein the second bipolar device region extends within the overlying semiconducting layer;
   forming a second device base region that has the second conductivity type within the second device well;
   forming a second device emitter region that has the first conductivity type within the second device well; and
   forming a sinker well that has the first conductivity type within the overlying semiconducting layer such that the sinker well electrically separates the second bipolar device region from the first bipolar device region, wherein
   the forming the second device well comprises forming a first well region and a second well region, wherein
      the first well region has a first well region peak doping concentration,
      the second well region has a second well region peak doping concentration that is greater than the first well region peak doping concentration,
      the second device base region extends within the first well region, and
      the second device emitter region extends within the second well region.

17. A method of forming an electrostatic discharge (ESD) protection device, the method comprising:
   forming a first device base region that has a first conductivity type within a first bipolar device region that has the first conductivity type, wherein
      the first bipolar device region extends within an overlying semiconducting layer that is supported by a buried semiconducting layer that has the first conductivity type,
      the buried semiconducting layer is supported by a semiconductor substrate, and
      the buried semiconducting layer electrically separates the overlying semiconducting layer from the semiconductor substrate;
   forming a first device emitter region that has a second conductivity type within the first bipolar device region, wherein the second conductivity type is different from the first conductivity type;
   forming a second device well that has the second conductivity type within a second bipolar device region that has the second conductivity type, wherein the second bipolar device region extends within the overlying semiconducting layer;
   forming a second device base region that has the second conductivity type within the second device well;
   forming a second device emitter region that has the first conductivity type within the second device well; and
   forming a sinker well that has the first conductivity type within the overlying semiconducting layer such that the sinker well electrically separates the second bipolar device region from the first bipolar device region, wherein
   the forming the second device well comprises forming a first well region, a second well region, and a third well region, wherein
      the first well region has a first well region peak doping concentration,
      the second well region has a second well region peak doping concentration that is greater than the first well region peak doping concentration,
      the third well region has a third well region peak doping concentration that is greater than the second well region peak doping concentration,
      the second device base region extends within the first well region, wherein the second device emitter region extends within the third well region, and
      the third well region separates the first well region from the second well region.

* * * * *